(12) United States Patent
Akahoshi

(10) Patent No.: US 9,491,860 B2
(45) Date of Patent: Nov. 8, 2016

(54) WIRING BOARD AND ELECTRONIC APPARATUS

(71) Applicant: FUJITSU LIMITED, Kawasaki-shi, Kanagawa (JP)

(72) Inventor: Tomoyuki Akahoshi, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 131 days.

(21) Appl. No.: 14/299,229

(22) Filed: Jun. 9, 2014

(65) Prior Publication Data

US 2015/0000967 A1 Jan. 1, 2015

(30) Foreign Application Priority Data

Jul. 1, 2013 (JP) ................................. 2013-137722

(51) Int. Cl.

| H05K 1/11 | (2006.01) |
|---|---|
| H05K 3/30 | (2006.01) |
| H05K 1/18 | (2006.01) |
| H01P 5/18 | (2006.01) |
| H05K 1/02 | (2006.01) |
| H05K 1/16 | (2006.01) |

(52) U.S. Cl.
CPC .............. *H05K 1/116* (2013.01); *H01P 5/185* (2013.01); *H05K 1/0239* (2013.01); *H05K 1/181* (2013.01); *H05K 3/30* (2013.01); *H05K 1/162* (2013.01); *H05K 2201/09672* (2013.01); *Y10T 29/4913* (2015.01)

(58) Field of Classification Search
CPC .... H05K 1/116; H05K 1/181; H05K 1/0239; H01P 5/185
USPC ................................. 174/250, 260
See application file for complete search history.

(56) References Cited

U.S. PATENT DOCUMENTS

| 5,466,892 A * | 11/1995 | Howard ............... H05K 1/0239 174/250 |
| 5,972,231 A * | 10/1999 | DiBene, II ............. H05K 1/162 216/13 |
| 6,373,275 B1 * | 4/2002 | Otsuka ................ G06F 13/4086 326/30 |
| 2007/0297157 A1* | 12/2007 | Tanaka ............. H01L 23/49822 361/766 |

(Continued)

FOREIGN PATENT DOCUMENTS

| DE | 29 07 837 A1 | 9/1979 |
| DE | 198 37 025 A1 | 2/2000 |
| JP | H10-93248 | 4/1998 |
| JP | 2006-41144 A1 | 2/2006 |
| JP | 2009-200108 A1 | 9/2009 |

OTHER PUBLICATIONS

Extended European Search Report of European Patent Application No. 14171306.5 dated Dec. 5, 2014.

(Continued)

*Primary Examiner* — Hoa C Nguyen
*Assistant Examiner* — Amol Patel
(74) *Attorney, Agent, or Firm* — Kratz, Quintos & Hanson, LLP

(57) ABSTRACT

A wiring board includes a first insulating layer; a first wire that is provided at a first surface of the first insulating layer and transmits a first signal; and a second wire that is provided at a second surface of the first insulating layer that is opposite to the first surface, includes a first portion that is parallel to at least a portion of the first wire, and transmits a first component of the first signal that is transmitted through the first wire.

9 Claims, 23 Drawing Sheets

(56) References Cited

U.S. PATENT DOCUMENTS

2011/0156843 A1* 6/2011 Lee .................. H01P 3/088
333/24 R
2012/0000700 A1* 1/2012 Liu ................... H05K 1/162
174/261

OTHER PUBLICATIONS

Ning Yang et al. "Broadband and Compact Coupled Coplanar Stripline Filters With Impedance Steps", IEEE Transactions on Microwave Theory and Techniques, IEEE Service Center, Piscataway, NJ, US, vol. 55, No. 12, Dec. 1, 2007, pp. 2874-2886, XP011197153.

Le Ye et al: "Miniature CMOS Stacked Spiral-Coupled Directional Coupler With $-$ 67-dB Isolation and $-$ 0.8-dB Insertion Loss", IEEE Electron Device Letters, IEEE Service Center, New York, NY, US, vol. 33, No. 7, Jul. 1, 2012, pp. 919-921, XP011448511.

Ryu G-H et al: "A Novel 3-DB Coupler for MMIC Using Air-Gap Stacked Microstrip Lines", IEEE Microwave and Guided Wave Letters, IEEE Inc, New York, US, vol. 10, No. 1, Jan. 1, 2000, pp. 1-03, XP000930365.

* cited by examiner

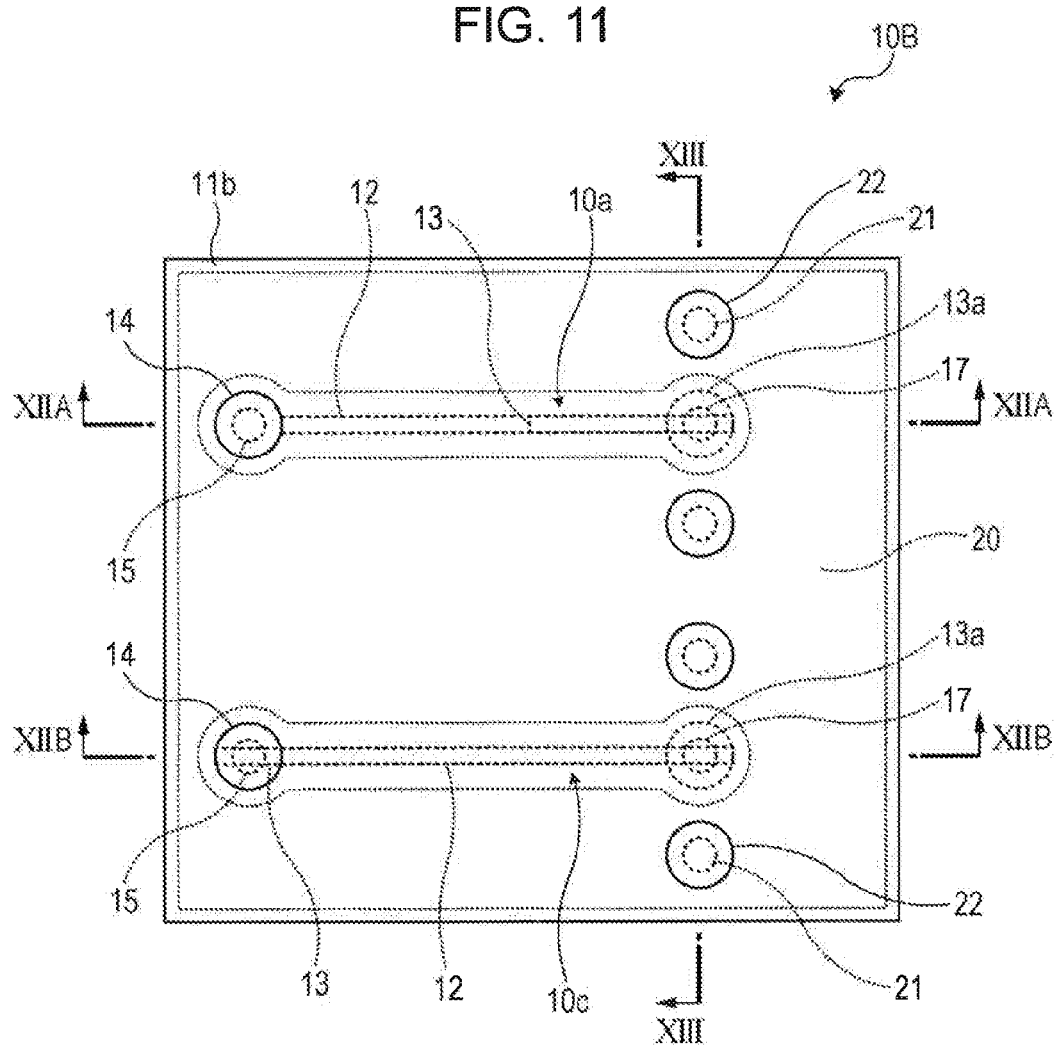

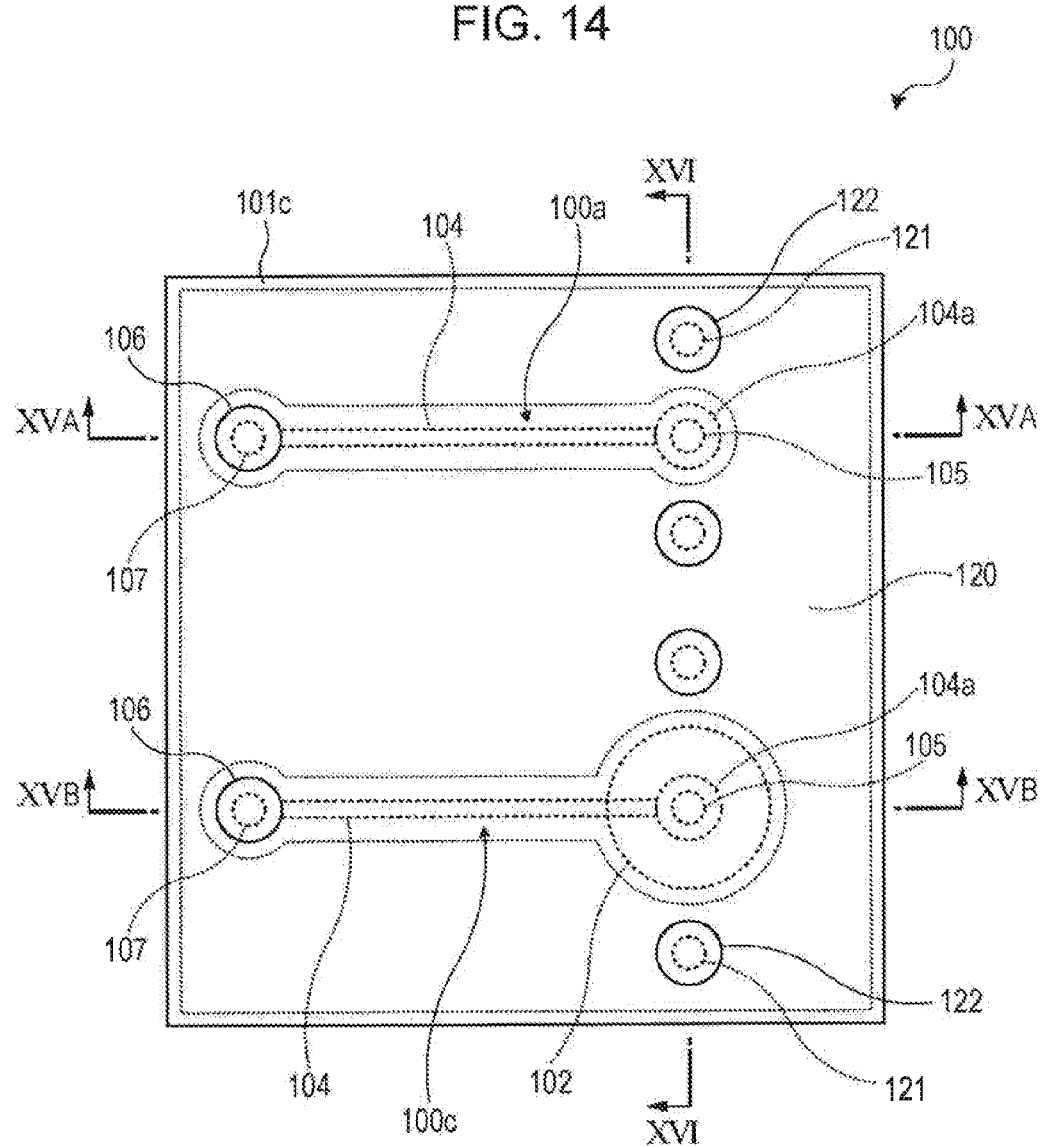

WIRING BOARD AND ELECTRONIC APPARATUS

CROSS-REFERENCE TO RELATED APPLICATION

This application is based upon and claims the benefit of priority of the prior Japanese Patent Application No. 2013-137722, filed on Jul. 1, 2013, the entire contents of which are incorporated herein by reference.

FIELD

The embodiments discussed herein are related to a wiring board and an electronic apparatus.

BACKGROUND

A technology for transmitting a signal by performing alternating current (AC) coupling is known. There is a technique as an AC coupling technique that incorporates a condenser or capacitor in a wiring board on which an electronic component such as a semiconductor device is mounted. For example of the technique, there is known a wiring board on which a condenser is formed by signal-line pads that oppose each other with a certain insulating layer being interposed therebetween. The signal lines are provided on upper and lower surfaces of the certain insulating layer.

Japanese Laid-open Patent Publication No. 2009-200108 is an example of a related art.

SUMMARY

According to an aspect of the invention, a wiring board includes a first insulating layer; a first wire that is provided at a first surface of the first insulating layer and transmits a first signal; and a second wire that is provided at a second surface of the first insulating layer that is opposite to the first surface, includes a first portion that is parallel to at least a portion of the first wire, and transmits a first component of the first signal that is transmitted through the first wire.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates an exemplary wiring board according to a second embodiment (part 1);

FIG. 14 illustrates a comparative example of the wiring board (part 1);

DESCRIPTION OF EMBODIMENTS

In the wiring board incorporating a capacitor, such as that described in the background, increase of the capacitance value of the capacitor is achieved by increasing the areas of the pads that oppose each other with the insulating layer being interposed therebetween. However, when the areas of the pads are increased for obtaining a large capacitance value in this way, it gives rise of increase of the occupied area of the capacitor in the wiring board. This may reduce the wiring density of wires that are capable of being disposed in the wiring board.

Therefore it is desired to provide a wiring board including a capacitor of a desired capacitance value without increasing the occupied area of the capacitor and an electronic apparatus including the wiring board.

First, there is described an exemplary wiring board 100 incorporating a capacitor.

Figure 1A:
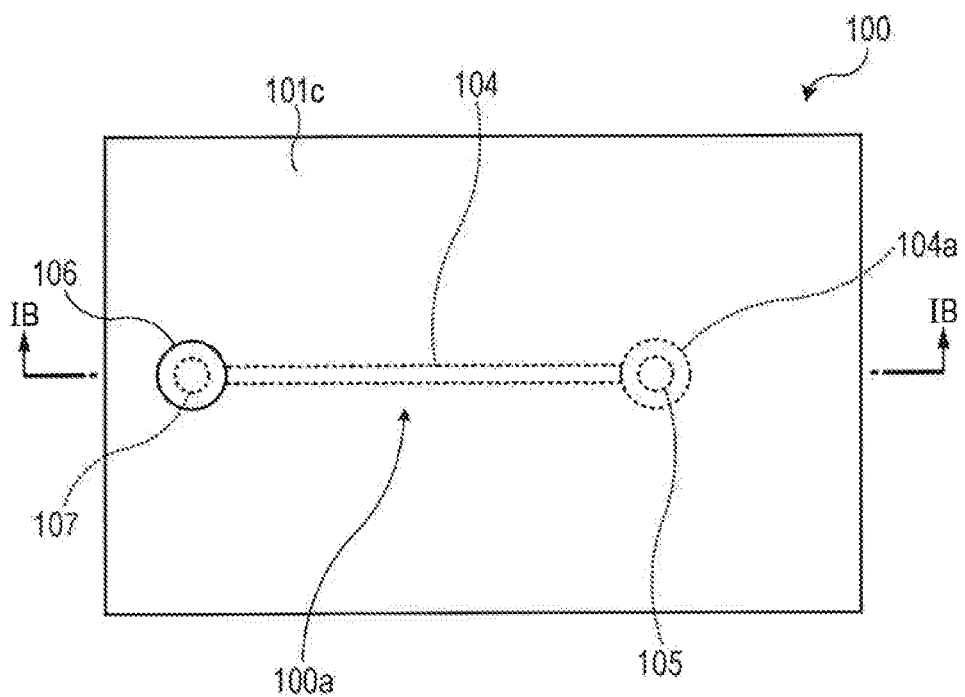
FIGS. 1A and 1B illustrate an exemplary wiring board.
Figure 1B:
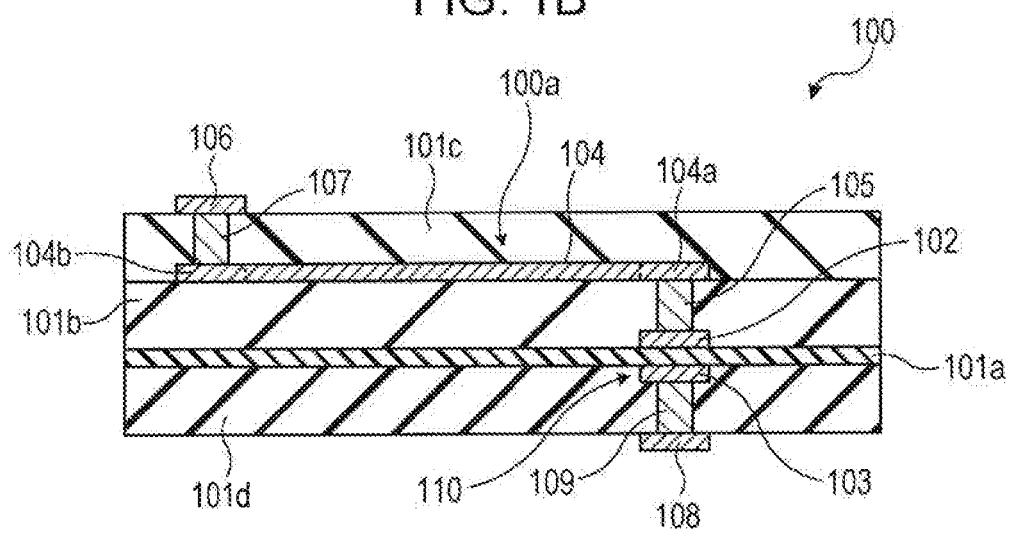

FIGS. 1A and 1B illustrate the exemplary wiring board 100. FIG. 1A is a schematic top view of the wiring board 100, and FIG. 1B is a schematic sectional view taken along line IB-IB in FIG. 1A.

The wiring board 100 illustrated in FIGS. 1A and 1B includes a conductor 102 and a conductor 103, which are provided on an upper surface of an insulating layer 101a and a lower surface of the insulating layer 101a, respectively. The conductors 102 and 103 have, for example, circular or polygonal planar shapes, and have the same or substantially the same planar shapes. The conductor 102 and the conductor 103 are provided so as to oppose each other with the insulating layer 101a being interposed therebetween. The conductors 102 and 103 are also called pads.

An insulating layer 101b is provided at an upper side of the insulating layer 101a. A wire 104 serving as a signal wire is provide at an upper side of the insulating layer 101b, where the wire 104 is illustrated a linear wire 104 as example. A land 104a and a land 104b are provided at corresponding ends of the wire 104. The land 104a and the land 104b are formed continuously with the wire 104 and have wider widths than the wire 104. The land 104a of the wire 104 is coupled to the conductor 102 provided at the upper side of the insulating layer 101a, via a via 105 extending through the insulating layer 101b. An insulating layer 101c is provided at the upper side of the insulating layer 101b. A conductor 106 is provided at an upper side of the insulating layer 101c. The land 104b of the wire 104 is coupled to the conductor 106 provided at the upper side of the insulating layer 101c, via a via 107 extending through the insulating layer 101c. The conductor 106, provided at the upper side of the insulating layer 101c, is used, for example, as a pad to which a terminal of an electronic component is coupled or as a conductor that is connected to such a pad. The electronic component is for example a semiconductor device that is mounted on the wiring board 100.

An insulating layer 101d is provided at a lower side of the insulating layer 101a. A conductor 108 is provided at a lower side of the insulating layer 101d. The conductor 108 is coupled to the conductor 103 disposed at the lower side of the insulating layer 101a, via a via 109 extending through the insulating layer 101d. The conductor 108 is used, for example, as a pad for connecting the wiring board 100 to another wiring board such as a mother board or as a conductor that is coupled to such a pad.

The conductor 102, the conductor 103, the wire 104, the lands 104a and 104b, the via 105, the conductor 106, the via 107, the conductor 108, and the via 109 are each formed using a certain or predetermined conductive material. Examples thereof include copper (Cu), a material including Cu, aluminum (Al), and a material including Al.

The diameters of the conductors 102 and 103 may be, for example, from 100 µm to 500 µm. The width of the wire 104 may be, for example, from 20 µm to 30 µm. The diameters of the lands 104a and 104b and the diameters of the conductors 106 and 108 may be, for example, 100 µm. The diameters of the vias 105, 107, and 109 may be, for example, 50 µm.

The wiring board 100 includes a structural section 100a described above. A capacitor 110 is formed by conductors 102 and 103 that oppose each other with the insulating layer 101a being interposed therebetween in the wiring board 100. The capacitor 110 that is embedded or incorporated in such a wiring board 100 is used for AC coupling.

With improving performance of a semiconductor device in an electronic apparatus in recent years, the frequency of a signal that is transmitted in the semiconductor device also increases from a level of a few GHz to a level of a few tens of GHz. In high-speed transmission, AC coupling is used for cutting a low-frequency-component in the signal. As a technique of achieving the AC coupling, for example, there is provided as described above the technique of incorporating the capacitor 110 in the wiring board 100 in addition to a technique of providing a chip condenser on a transmission line for a high-speed signal.

In the wiring board 100, for example, a high-speed signal is transmitted through the wire 104 via the via 107 from the conductor 106 at one of the surfaces (front surface) of the wiring board 100. Further the high-speed signal is transmitted to the capacitor 110 formed by the conductors 102 and 103 that oppose each other with the insulating layer 101a via the via 105, where the insulating layer 101a is interposed between the conductors 102 and 103. A low-frequency-domain component included in the high-speed signal is cut when the transmitted high-speed signal passes the capacitor 110. The high-speed signal whose low-frequency-domain component has been cut is transmitted to the conductor 108 at the other surface or a back surface via the via 109.

The capacitance value of the capacitor 110 in such a wiring board 100 is adjustable based on areas (planar sizes) S of the conductors 102 and 103, a thickness t of the insulating layer 101a (the distance between the conductors 102 and 103), and the characteristics of the material of the insulating layer 101a (dielectric constant ∈ and dielectric tangent tan δ). The capacitance value of the capacitor 110 of the wiring board 100 is set based on a demanded value of a frequency domain that is cut by the AC coupling.

For example, when the capacitance value of the capacitor 110 is adjusted based on the areas of the conductors 102 and 103, the areas of the conductors 102 and 103 are increased in order to increase the capacitance value.

Figure 2A:
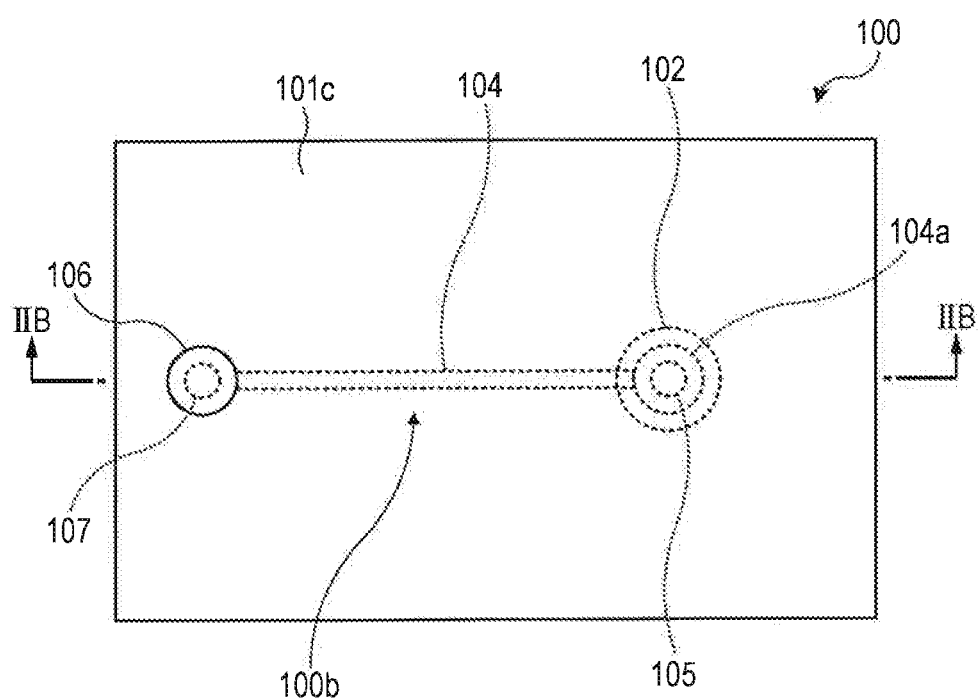
FIGS. 2A and 2B illustrate an exemplary wiring board in which a capacitance value is changed (part 1)
Figure 2B:
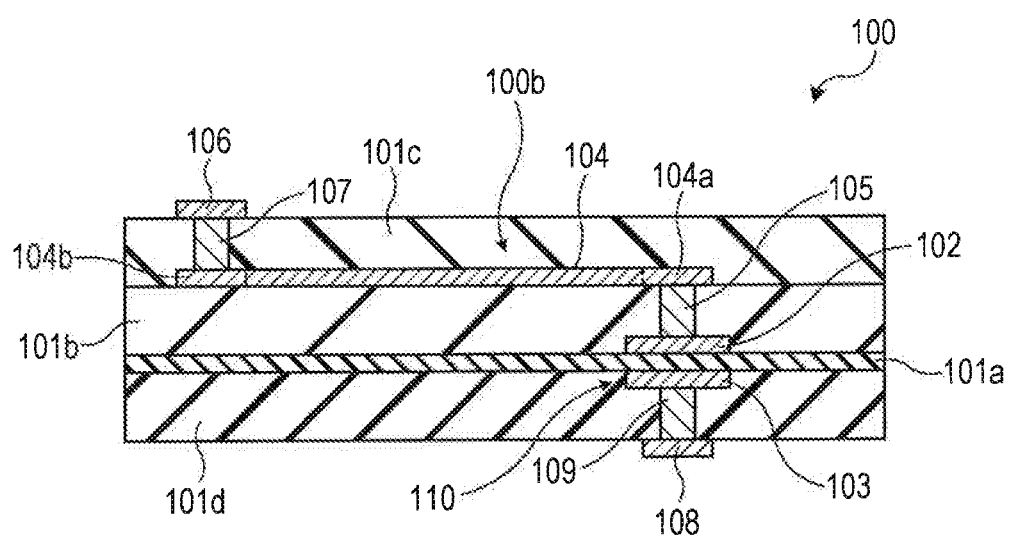
Figure 3A:
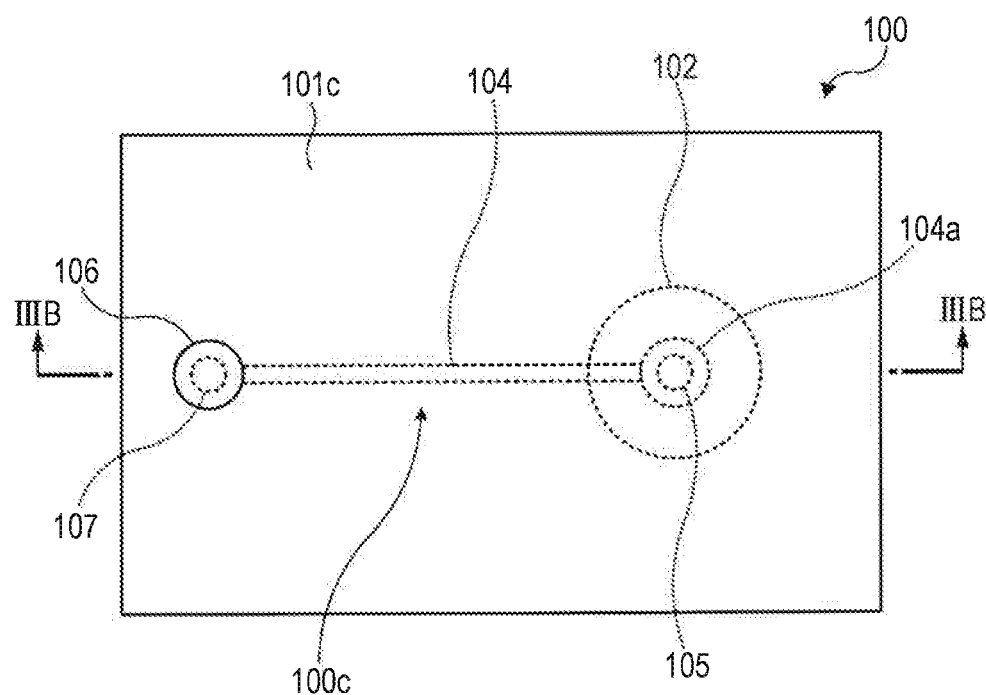
FIGS. 3A and 3B illustrate an exemplary wiring board in which a capacitance value is changed (part 2)
Figure 3B:
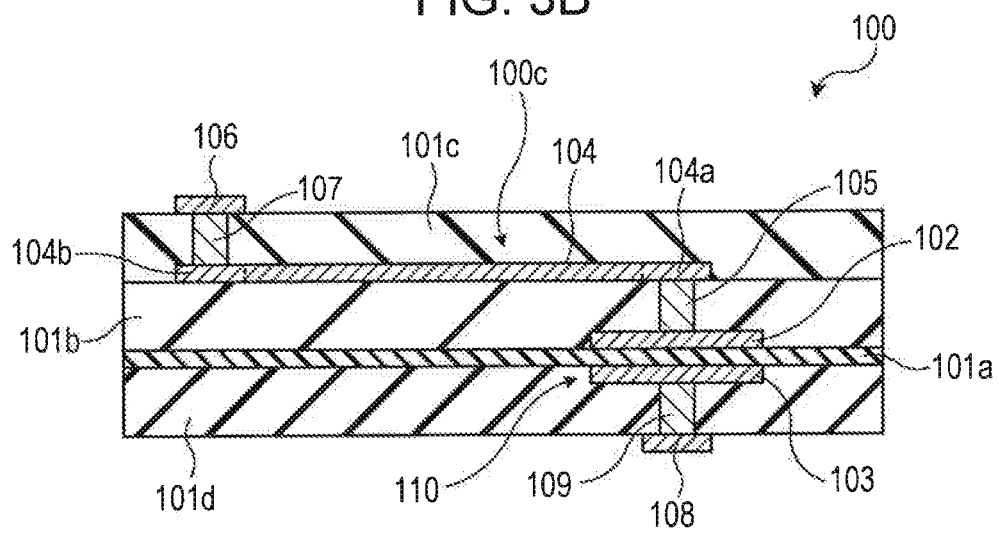

FIGS. 2A and 2B and FIGS. 3A and 3B each illustrate an exemplary wiring board 100 in which a capacitance value is changed. FIG. 2A is a schematic top view of the wiring board 100, and FIG. 2B is schematic sectional view taken along line IIB-IIB in FIG. 2k FIG. 3A is a schematic top view of the wiring board 100, and FIG. 3B is a schematic sectional view taken along line IIIB-IIIB in FIG. 3A.

When the capacitance value of the capacitor 110 illustrated in FIGS. 1A and 1B is to be increased, for example, the areas of conductors 102 and 103 opposing each other with an insulating layer 101a are increased as in a structural section 100b illustrated in FIGS. 2A and 2B. When the capacitance value of the capacitor 110 is to be further increased, the areas of the conductors 102 and 103 that oppose each other with an insulating layer 101a are further increased as in a structural section 100c illustrated in FIGS. 3A and 3B. In this way, by changing the areas of conductors 102 and 103, there is achieved the wiring boards 100 including capacitors having different capacitance values.

The wiring board 100 may include a plurality of each of the structural sections 100a, 100b, and 100c, illustrated from FIGS. 1A to 3B. In addition, the wiring board 100 may include two or more of types of structural sections 100a, 100b, and 100c, illustrated from FIGS. 1A to 3B.

Figure 4A:
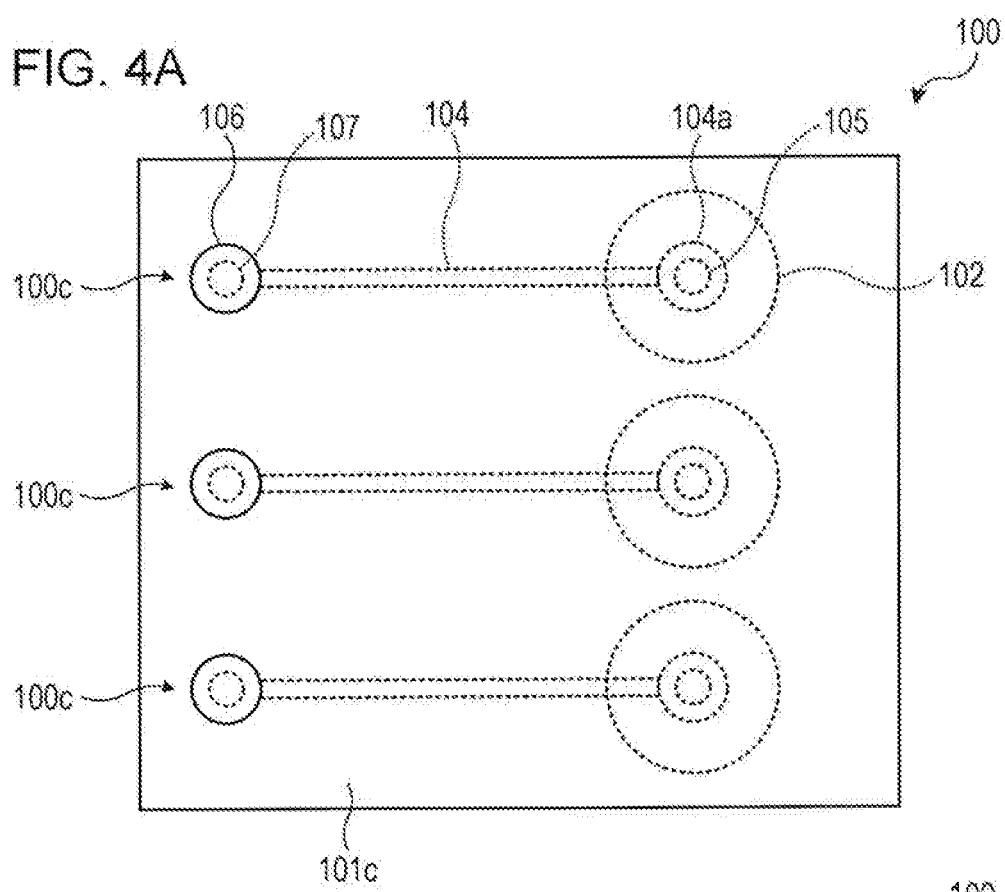
FIGS. 4A and 4B each illustrate an exemplary structure of a wiring board.
Figure 4B:
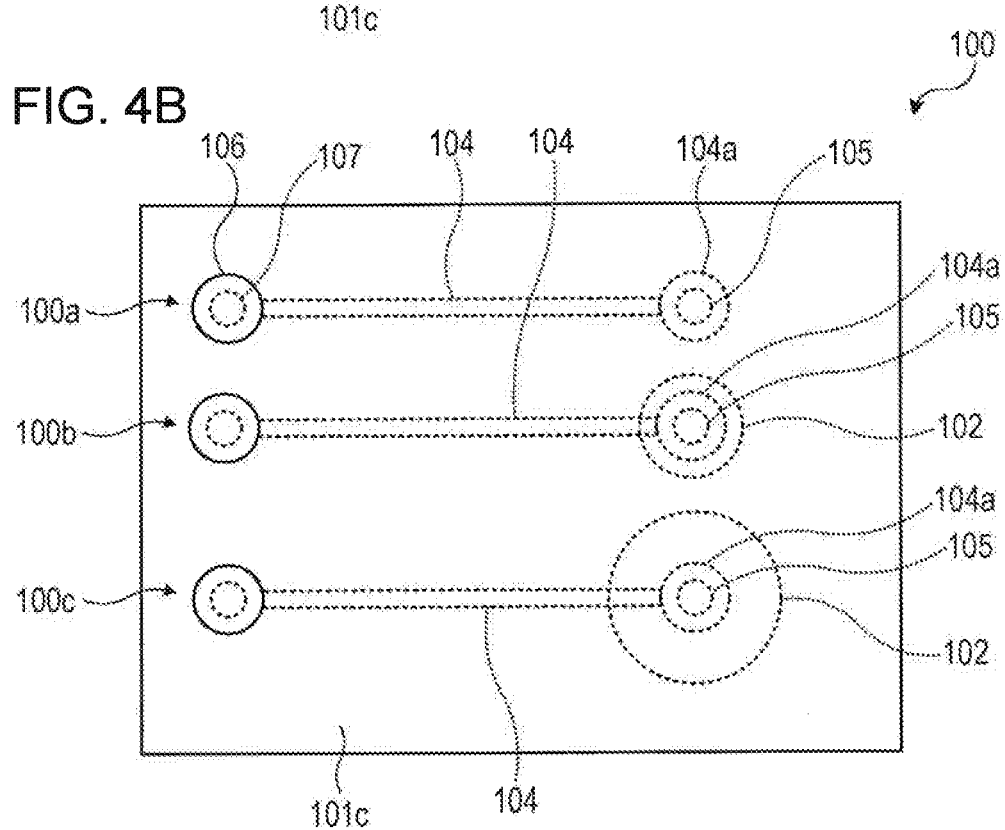

FIGS. 4A and 4B each illustrate an exemplary structure of a wiring board 100.

FIG. 4A is a schematic top view of a wiring board 100, and illustrates an example in which three structural sections 100c illustrated in FIGS. 3A and 3B are disposed. The wiring board 100 may include the structural sections 100a, 100b illustrated in FIGS. 1A to 2B instead of the structural section 100c. The wiring board 100 may include a plurality of structural sections 100c including capacitors 110 having certain capacitance values as illustrated in FIG. 4A. FIG. 4B is a schematic top view of the wiring board 100, and illustrates an example in which there are disposed one structural section 100a, one structural section 100b, and one structural section 100c illustrated in FIGS. 1A to 3B. As illustrated in FIG. 4B, the wiring board 100 include one structural section 100a, one structural section 100b, and one structural section 100c including capacitors having different capacitance values. The structure of the wiring board 100 is determined based on, for example, the use of the wiring board 100 such as the type of electronic component to be mounted and the type of signal that is transmitted to the wiring board 100.

When the areas of the conductors 102 and 103 are increased in order to increase the capacitance value of each capacitor 110 as described above, the occupied area of each capacitor 110 is increased. This may reduce the arrangement density of the wires 104, serving as signal wires, of the wiring board 100.

For example, when a plurality of structural sections 100c (see FIGS. 3A and 3B) are disposed as illustrated in FIG. 4A, their conductors 102 and 103 are disposed apart from each other by a fixed distance. Therefore, the pitches between the wires 104 including the structural sections 100c are increased compared to a case with use of a plurality of structural sections 100b illustrated in FIGS. 2A and 2B in which areas of the conductors 102 and 103 are smaller than those of the structural sections 100c. Similarly, when a plurality of structural sections 100b illustrated in FIGS. 2A and 2B are disposed, the pitch between the wires 104 is increased compared to a case of use with a plurality of structural sections 100a illustrated in FIGS. 1A and 1B in which areas of the conductors 102 and 103 areas are smaller than those of the structural sections 100b. As a result, the arrangement density of the wires 104 is reduced. Even when, as illustrated in FIG. 4B, the structural section 100a, the structural section 100b, and the structural section 100c respectively illustrated in FIGS. 1A to 3B are disposed, the pitch between the wires 104 is increased because of including the conductors 102 and 103 having large areas. This reduces the arrangement density of the wires 104.

Accordingly, increase of the capacitance values of the capacitors 110 may cause increase of the occupied areas thereof. As a result, there is deceased the arrangement density of the wires 104 serving as signal wires.

It is possible to form a capacitor using pads each provided corresponding end portions of wires disposed at upper and lower sides of the insulating layer 101a of the wiring board 100, where the pads oppose each other and the wires do not oppose each other. However, even in this case, when, in order to increase the capacitance values of the capacitors, the areas of the pads are increased, and the occupied areas of the capacitor increase. Accordingly, the arrangement density of signal wires may be similarly reduced as mentioned above.

In view of the above-described points, wiring boards according to the following embodiments are provided. First, a first embodiment is described.

Figure 5A:
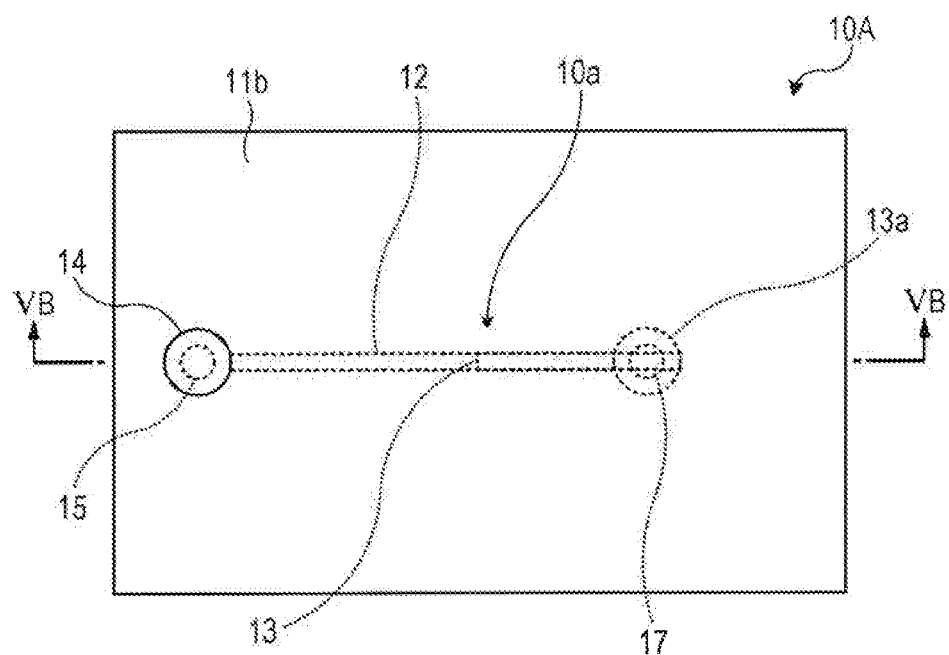
FIGS. 5A and 5B illustrate a first exemplary wiring board according to a first embodiment.
Figure 5B:
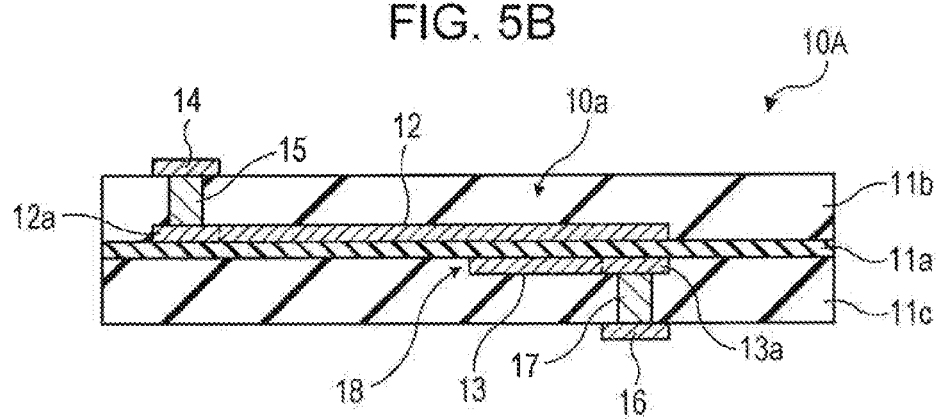

FIGS. 5A and 5B illustrate a first exemplary wiring board 10A according to the first embodiment. FIG. 5A is a schematic top view of the wiring board 10A, and FIG. 5B is a schematic sectional view taken along line VB-VB in FIG. 5A.

The wiring board 10A illustrated in FIGS. 5A and 5B include wires 12 and 13 which have linear shape as example. The wires 12 and 13 are provided at upper and lower surfaces of an insulating layer 11a. The wires 12 and 13 are signal wires that transmit signals therethrough. The wires 12 and 13 oppose each other with the insulating layer 11a interposed therebetween. The wire 13 is disposed at a lower side of the insulating layer 11a and provided in parallel with part of the wire 12 which is disposed at an upper side of the insulating layer 11a. The wires 12 and 13 may have the same or substantially the same wiring widths. The wires 12 and 13 may also have the same or substantially the same wiring widths as other signal wires that are provided in the wiring board 10A.

An insulating layer 11b is provided at an upper side of the insulating layer 11a, and a conductor 14 is provided at an upper side of the insulating layer 11b. A land 12a is disposed at the upper side of the insulating layer 11a and provided at one end portion of the wire 12. The land 12a is formed continuously with the wire 12 and has a width wider than that of the wire 12. A land is not provided at the other end portion of the wire 12. The land 12a at the wire 12 is coupled to the conductor 14 via a via 15 extending through the insulating layer 11b. The conductor 14 is used, for example, as a pad which is coupled to a terminal of an electronic component that is mounted on the wiring board 10A, or as a conductor that is coupled to such a pad. The electronic component is a semiconductor device, for example.

An insulating layer 11c is provided at the lower side of the insulating layer 11a. A conductor 16 is provided at a lower side of the insulating layer 11c. A land 13a is disposed at the lower side of the insulating layer 11c and provided at one end portion of the wire 13. The land 13a is formed continuously with the wire 13 and has a width wider than that of the wire 13. A land is not provided at the other end portion of the wire 13. The land 13a at the wire 13 is coupled to the conductor 16 via a via 17 extending through the insulating layer 11c. The conductor 16 is used, for example, as a pad for coupling the wiring board 10A to another wiring board, such as a mother board, or as a conductor that is connected to such a pad.

The wire 12, the land 12a, the wire 13, the land 13a, the conductor 14, the via 15, the conductor 16, and the via 17 are each formed using a certain or a predetermined conductive material. Examples thereof include copper (Cu), a material including Cu, aluminum (Al), and a material including Al.

The widths of the wires 12 and 13 may be, for example, from 20 µm to 30 µm. The diameters of the lands 12a and 13a and the diameters of the conductors 14 and 16 may be, for example, 100 µm. The diameters of the vias 15 and 17 may be, for example, 50 µm. The length of a portion where the wires 12 and 13 oppose each other may be, for example, 2 mm.

The wiring board 10A includes a structural section 10a illustrated above, where the wires 12 and 13 of the wiring board 10A are used as signal wires. In the structural section 10a of the wiring board 10A, a capacitor 18 is formed by disposing in parallel the wires 12 and 13, serving as signal wires, so as to oppose each other with the insulating layer 11a being interposed therebetween. Such a capacitor 18 is used in AC coupling. For example, a high-speed signal is transmitted through the wire 12 via the via 15 from the conductor 14 at one of the surfaces (front surface) of the wiring board 10A. The high-speed signal is further transmitted to the capacitor 18, formed by the wires 12 and 13 that oppose each other with the insulating layer 11a being interposed therebetween, via the insulating layer 11a. When the transmitted high-speed signal passes the capacitor 18, the capacitor 18 cuts or suppress a low-frequency-domain component included in the high-speed signal. The high-speed signal whose low-frequency-domain component has been cut is transmitted to the wire 13. The high-speed signal transmitted to the wire 13 is transmitted to the conductor 16 at the other surface (back surface) of the wiring board 10A via the via 17.

The capacitor 18 is formed by the wires 12 and 13 that oppose each other with the insulating layer 11a being interposed therebetween. Accordingly, the capacitance value of the capacitor 18 is adjustable by changing the length of the portion where the wires 12 and 13 oppose each other.

Figure 6A:
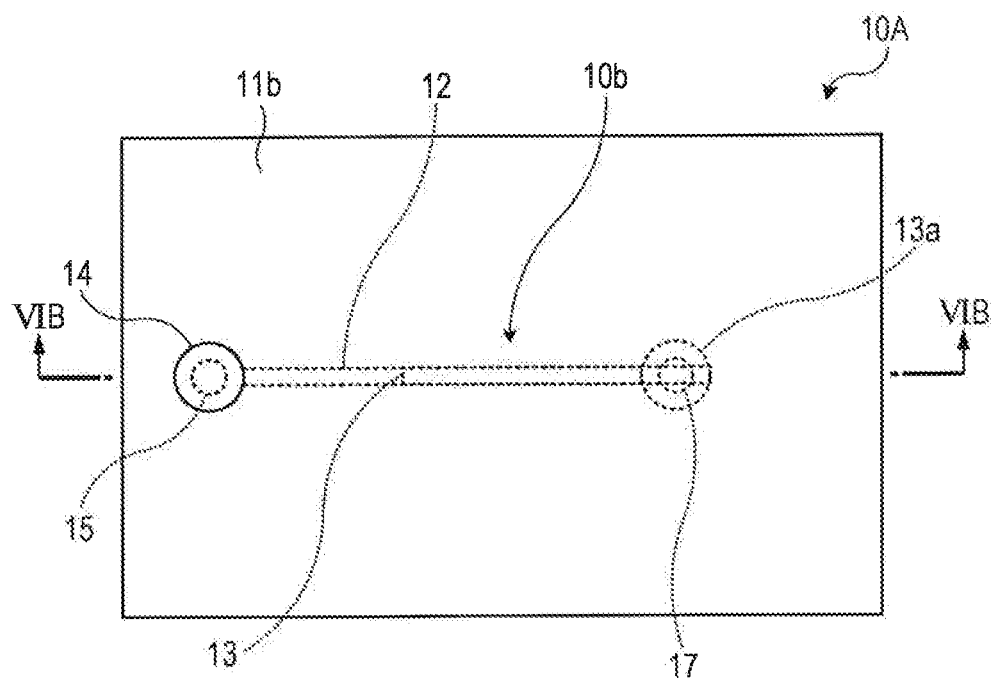
FIGS. 6A and 6B illustrate a second exemplary wiring board according to the first embodiment.
Figure 6B:
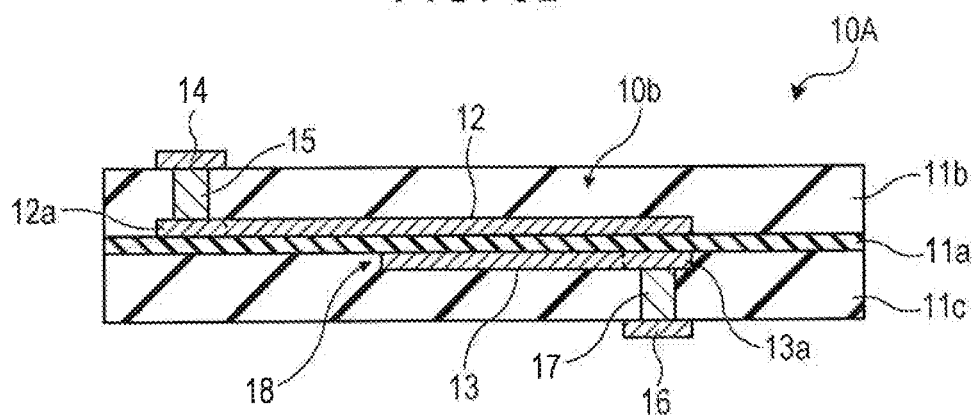
Figure 7A:
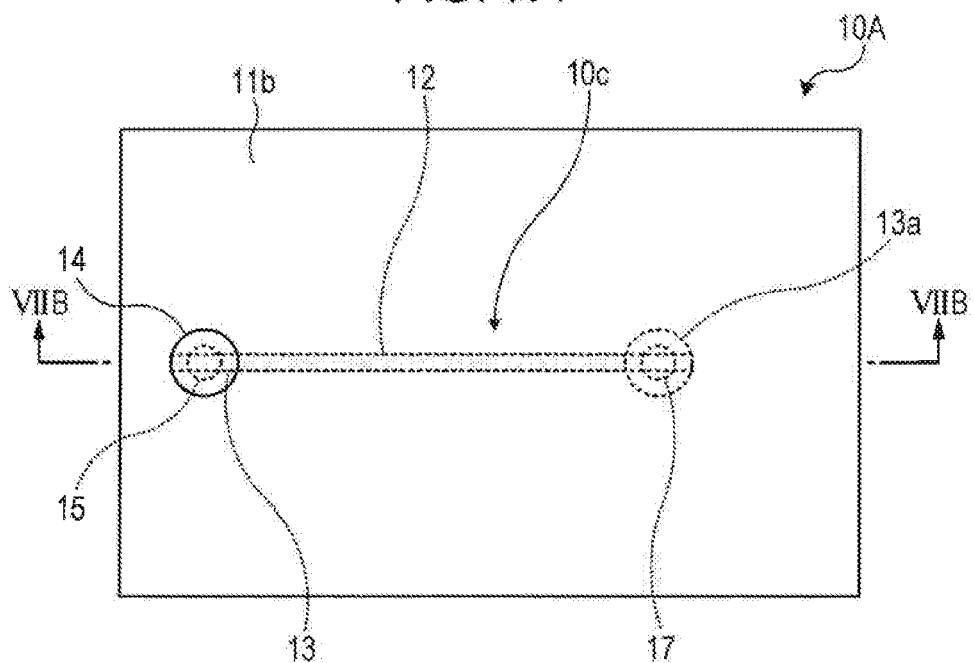
FIGS. 7A and 7B illustrate a third exemplary wiring board according to the first embodiment.
Figure 7B:
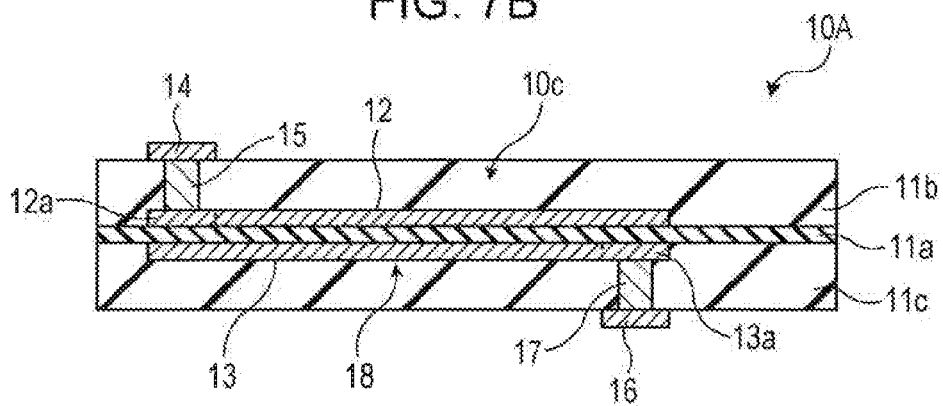

FIGS. 6A and 6B illustrate a second exemplary wiring board 10A according to the first embodiment. FIG. 6A is a schematic top view of the wiring board 10A. FIG. 6B is a schematic sectional view taken along line VIB-VIB in FIG. 6A. FIGS. 7A and 7B illustrate a third exemplary wiring board 10A according to the first embodiment. FIG. 7A is a schematic top view of the wiring board 10A. FIG. 7B is a schematic sectional view taken along line VIIB-VIIB in FIG. 7A.

For the increase of the capacitance value of the capacitor 18 of the structural section 10a illustrated in FIGS. 5A and 5B, for example, the length of the wire 13 opposing the wire 12 is increased as in a structural section 10b illustrated in FIGS. 6A and 6B. For example, the length of the portion where the wires 12 and 13 oppose each other is from 2 mm as in the structural section 10a to 5 mm as in the structural section 10b. Increasing the length of the overlap portion between wires 12 and 13 makes it possible to increase the capacitance value of the capacitor 18 as a result of increasing the area of the portion where the wires 12 and 13 having a certain or predetermined wiring widths oppose each other. When the capacitance value of the capacitor 18 is to be further increased, the area of the portion of overlap between the wires 12 and 13 is further increased by further increasing the length of the wire 13 opposing the wire 12 with the insulating layer 11a being interposed therebetween. For example, the length of the portion where the wires 12 and 13 oppose each other is from 5 mm as in the structural section 10b to 10 mm as in the structural section 10c. Accordingly, by changing the length of the portion where the wires 12 and 13 oppose each other, there may be achieved a wiring boards 10A including capacitors 18 having different capacitance values.

The wiring board 10A may include a plurality of each of the structural sections 10a, 10b, and 10c illustrated from FIGS. 5A to 7B. In addition, the wiring board 10A may include two or more types of structural sections 10a, 10b, and 10c illustrated from FIGS. 5A to 7B.

Figure 8A:
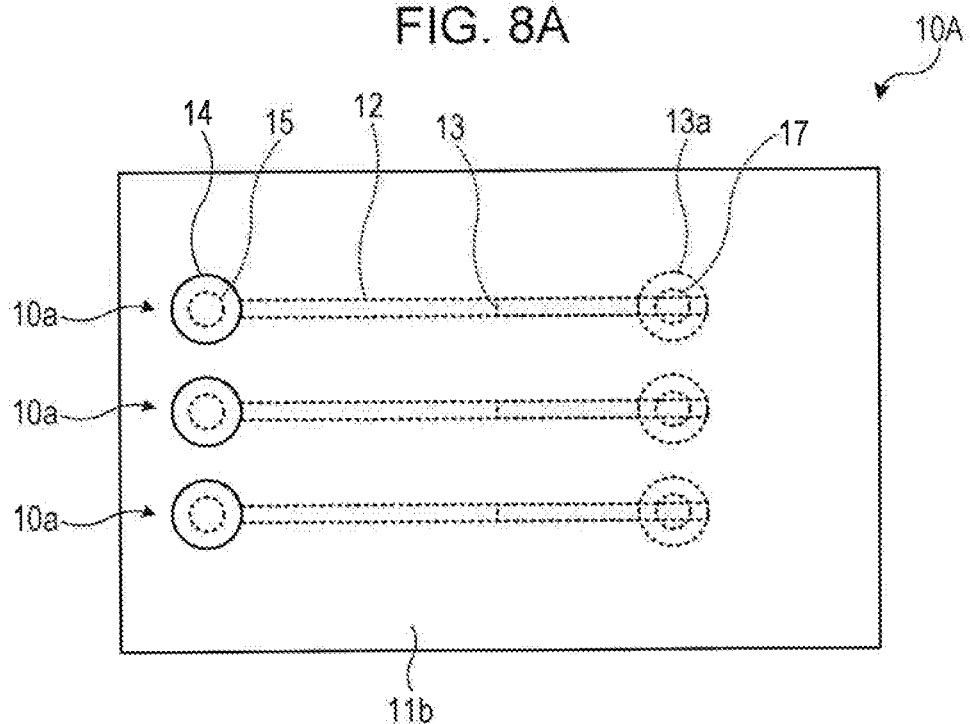
FIGS. 8A and 8B each illustrate an exemplary structure of a wiring board according to the first embodiment.
Figure 8B:
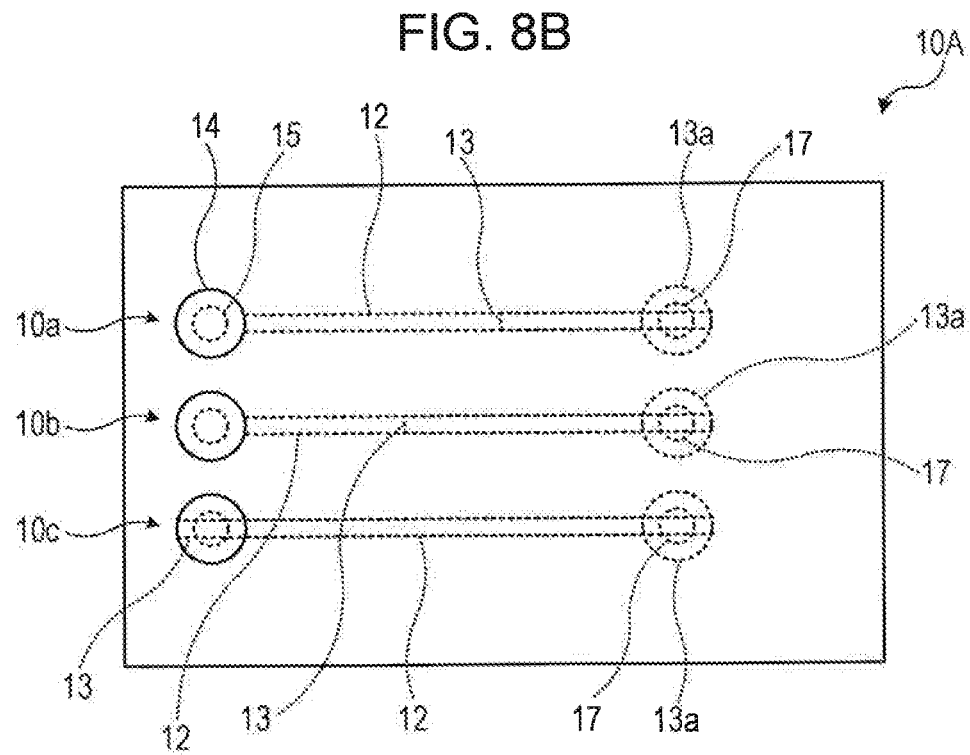

FIGS. 8A and 8B each illustrate an exemplary structure of a wiring board 10A according to the first embodiment. FIG. 8A is a schematic top view of the wiring board 10A and illustrates an example in which, of the structural sections 10a, 10b, and 10c illustrated in FIGS. 5A to 7B, three structural sections 10a illustrated in FIGS. 5A and 5B are disposed. As illustrated in FIG. 8A, the wiring board 10A may include a plurality of structural sections 10a including capacitors 18 having certain capacitance values. FIG. 8B is a schematic top view of the wiring board 10A, and illustrates an example in which the wiring board 10A includes one structural section 10a, one structural section 10b, and one structural section 10c illustrated in FIGS. 5A to 7B. As illustrated in FIG. 8B, the wiring board 10A may include one structural section 10a, one structural section 10b, and one structural section 10c including capacitors having different capacitance values. The structure of the wiring board 10A is determined based on, for example, the use of the wiring board 10A corresponding to the type of electronic component to be mounted, for example, and the type of signal that is transmitted through the wiring board 10A.

In the wiring board 10A including one of the types or two or more types of structural sections 10a, 10b, and 10c illustrated in FIGS. 5A to 7B, it is possible to suppress a reduction in the arrangement density of the wires 12 and 13 serving as signal wires, and obtain a desired capacitance value for each capacitor 18.

That is, in each wiring board 10A according to the first embodiment, each capacitor 18 is formed using the wires 12 and 13 that are disposed with the insulating layer 11a being interposed therebetween, and the capacitance value of each capacitor 18 is adjusted based on the length of the portion where the wires 12 and 13 oppose each other. Therefore, increase of the capacitance value of each capacitor 18 is achieved by increasing the lengths of the wire 12 and the wire 13, which is provided at a lower side of the insulating layer 11a. In this case, the occupied areas are not increased, where the occupied areas are the projected sizes as viewed from the top of the capacitors 18 of the structural sections 10a, 10b, and 10c. It is possible to suppress an increase in the occupied areas of the capacitors 18 in the wiring board 10A, while an increase of the areas of the capacitors 110 is caused by increasing the areas of the conductors 102 and 103 for increasing the capacitance values of the capacitors 110 in the wiring board 100. In the wiring board 10A, since it is possible to suppress an increase in the occupied areas of the capacitors 18, it is possible to dispose the structural sections 10a, 10b, and 10c at a certain interval in the wiring board 10A. As a result, it is possible to suppress a reduction in the arrangement density of the wires 12 and 13, serving as signal wires.

According to each wiring board 10A of the first embodiment, it may be possible to suppress a reduction in the arrangement density of the signal wires by suppressing an increase in the occupied area of a capacitor, and obtain a desired capacitance value. In the foregoing description, the wire 12 provided at the upper side of the insulating layer 11a is provided from the land 12a to a location corresponding to the land 13a of the wire 13. The land 12a is provided at one end portion to which the via 15 is connected and the land 13a is connected to the via 17 disposed at the lower side of the insulating layer 11a. The wire 12 may also be provided as illustrated in the following FIG. 9.

Figure 9:
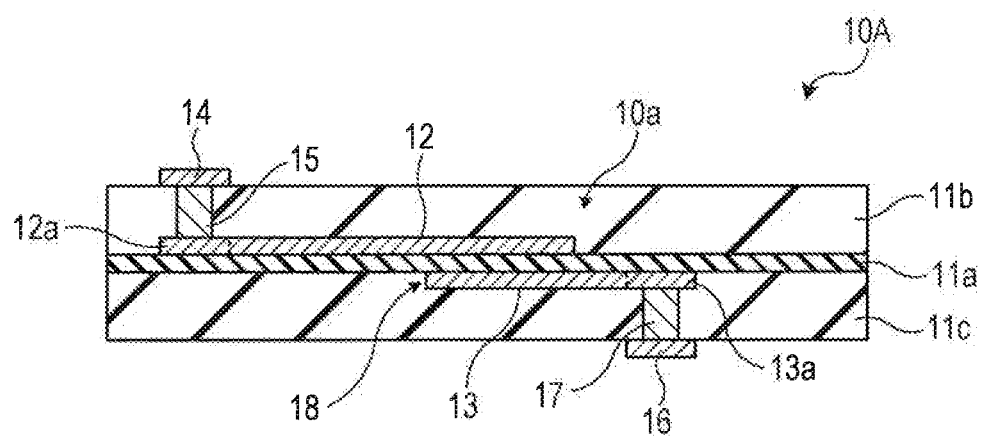
FIG. 9 illustrates a wiring board of a first modification according to the first embodiment.

FIG. 9 is a schematic sectional view of a wiring board 10A of a first modification according to the first embodiment. FIG. 9 schematically illustrates the wiring board 10A of the modification. As illustrated in FIG. 9, in the wiring board 10A, a wire 12 and a wire 13 are disposed at an upper side and a lower side of an insulating layer 11a, respectively. The wire 12 may be provided so as to have a length extending from a land 12a at one end portion of the wire 12 to a location in front of the location of a land 13a of a wire 13. Even in such a case, it is possible to form a capacitor 18 at a portion where the wires 12 and 13 oppose each other with the insulating layer 11a being interposed therebetween, and perform AC coupling for a signal that is transmitted between the wires 12 and 13.

In the foregoing description, the capacitance value of the capacitor 18 is adjusted by changing the wiring length of the wire 13 or the wiring lengths of the wires 12 and 13. When adjusting the capacitance value of the capacitor 18, in addition to changing the wiring length, it is possible to change or increase the wiring widths of the wires 12 and 13 within a range in which the arrangement density thereof is not reduced, for example, a range in which the widths of the lands 12a and 13a are not exceeded.

The insulating layer 11a that is provided between the wires 12 and 13. The insulating layer 11a may be one having a dielectric constant that is higher than those of insulating layers 11b and 11c. The capacitance value of the capacitor 18 may be adjustable based on the dielectric constant of the insulating layer 11a. The capacitance value of the capacitor 18 is also adjustable based on the thickness of the insulating layer 11a.

The shapes of the wires 12 and 13 are not limited to linear shapes, while the wires 12 and 13 serving as signal wires have linear shapes in the foregoing description. It is also possible to form a wiring board including the wiring board 10A.

Figure 10A:
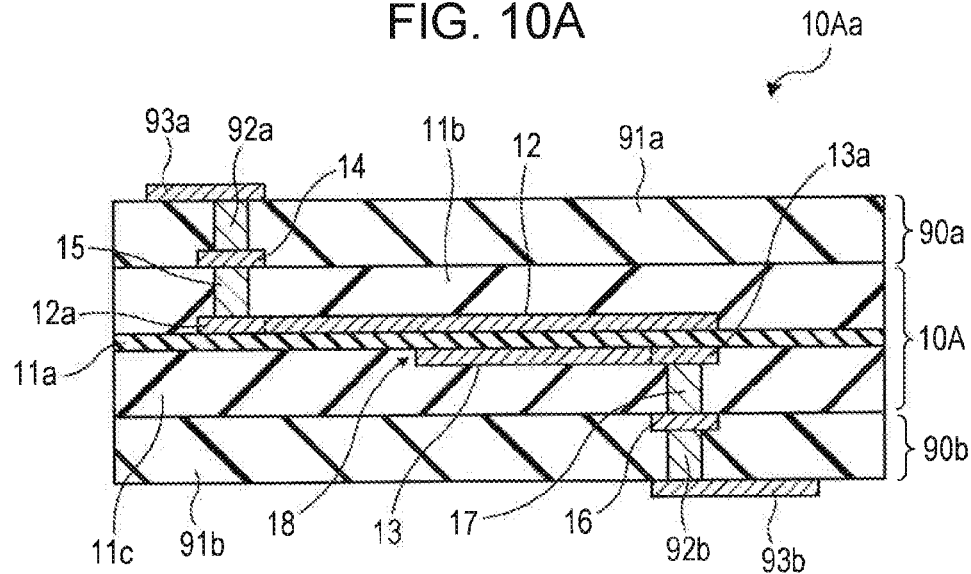
FIGS. 10A and 10B each illustrate a wiring board of a second modification according to the first embodiment.
Figure 10B:
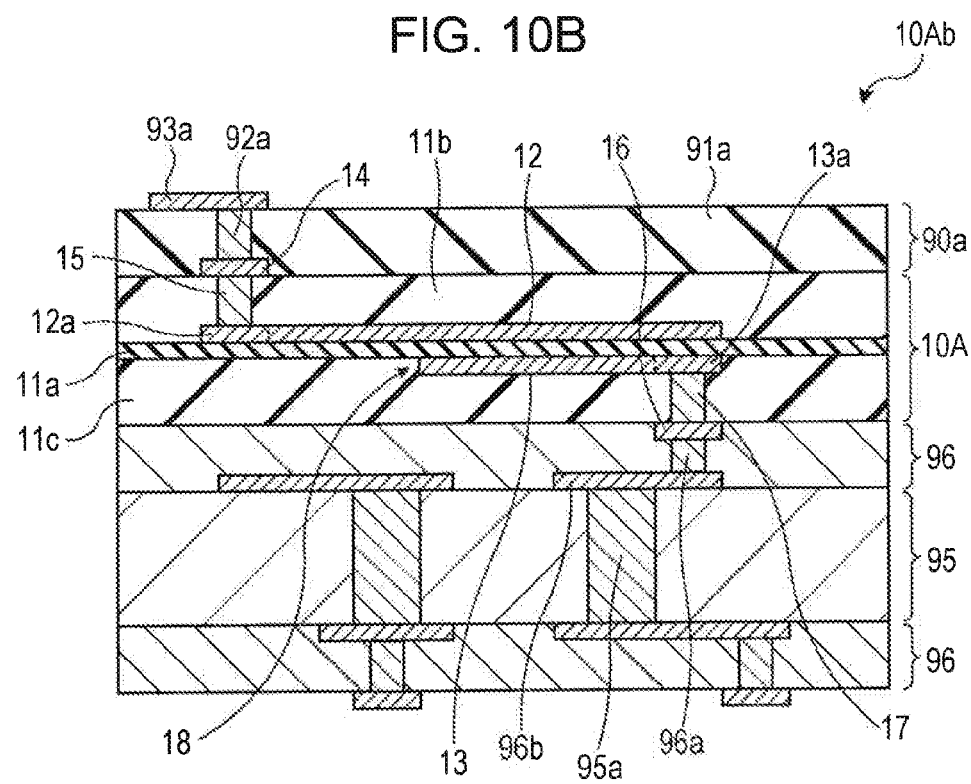

FIGS. 10A and 10B illustrate wiring boards 10Aa and 10Ab of a second modification according to the first embodiment. FIGS. 10A and 10B are schematic sectional views of the wiring board 10Aa and 10Ab, respectively. The wiring board 10Aa and 10Ab each includes the wiring board 10A.

The wiring board 10Aa illustrated in FIG. 10A includes, at a front side of the wiring board 10A described above, a layer 90a including an insulating layer 91a, a via 92a, and a wire 93a. The via 92a extends through the insulating layer 91a and is coupled to the conductor 14. The wire 93a is provided at an upper side of the insulating layer 91a and is coupled to the via 92a. The wiring board 10Aa also includes, at a back side of the wiring board 10A, a layer 90b including an insulating layer 91b, a via 92b, and a wire 93b. The via 92b extends through the insulating layer 91b and is coupled to the conductor 16. The wire 93b is provided at a lower side of the insulating layer 91b and is coupled to the via 92b.

Here, there is exemplified the case in which the front side of the wiring board 10A is provided with the layer 90a and the back side of the wiring board 10A is provided with the layer 90b. However, either one of the front side and the back side of the wiring board 10A may be provided with the layer 90a or the layer 90b. In addition, layers including a similar structure may be further placed on the layers 90a and 90b in the wiring board 10Aa.

The wiring board 10Ab illustrated in FIG. 10B includes a structure in which the wiring board 10A is formed on a core base 95 provided with a predetermined or certain conductor pattern. Here, there is given an example in which a layer 90a disposed on the wiring board 10A is placed upon the core base 95. The core base 95 is provided, at front and back sides thereof, with layers 96, each including a via 96a and a wire 96b. The layer 96 at the front side and the layer 96 at the back side are coupled to each other via a via 95a extending through the core base 95. A conductor 16 included in the wiring board 10A is, for example, coupled to the layer 96 at the front side of the core base 95, and routed to the back side via the via 95a of the core base 95.

In this way, it is possible to use part of the wiring board 10A and form the wiring boards 10Aa and 10Ab illustrated in FIGS. 10A and 10B. Next, a second embodiment is described.

Figure 12A:
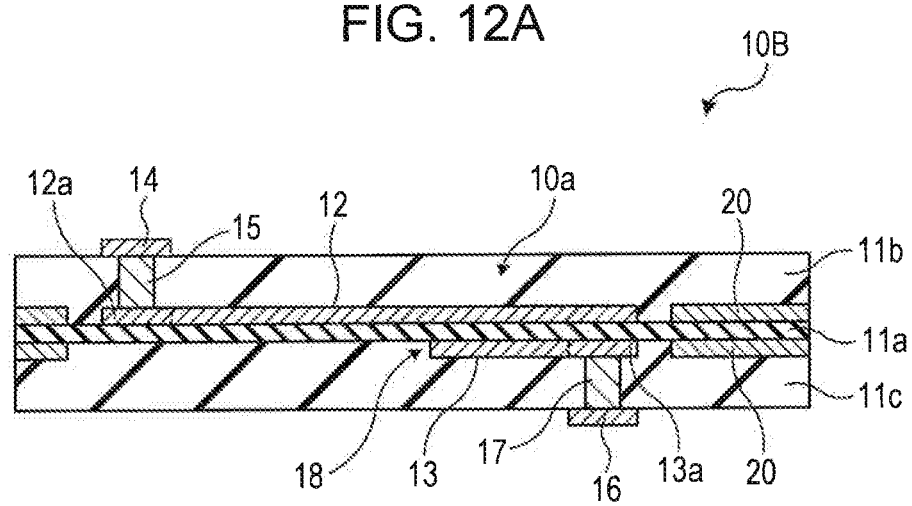
FIGS. 12A and 12B each illustrate the exemplary wiring board according to the second embodiment (part 2)
Figure 12B:
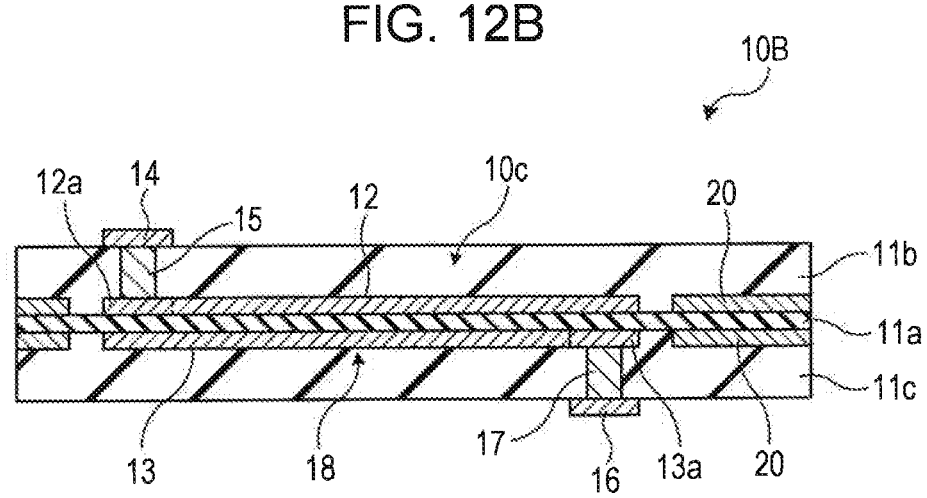
Figure 13:
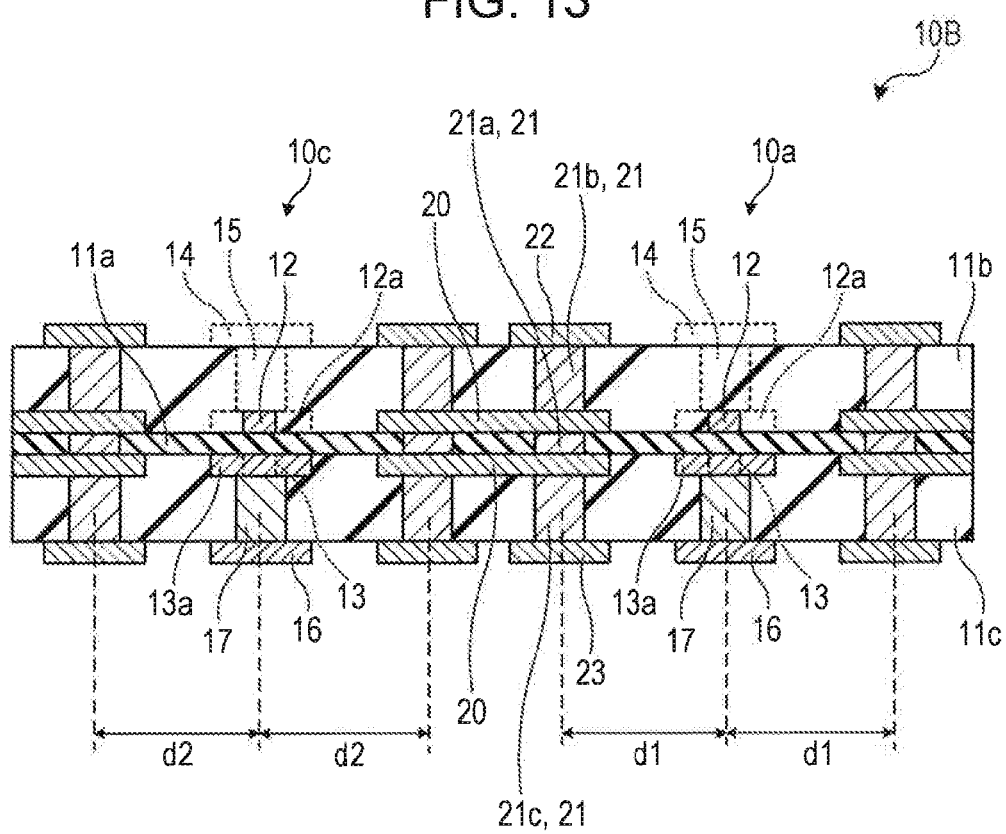
FIG. 13 illustrates the exemplary wiring board according to the second embodiment (part 3)

FIGS. 11 to 13 each illustrate an exemplary wiring board 10B according to the second embodiment. FIG. 11 is a schematic top view of the exemplary wiring board 10B according to the second embodiment. FIG. 12A is a schematic sectional view taken along line XIIA-XIIA in FIG. 11. FIG. 12B is a schematic sectional view taken along line XIIB-XIIB in FIG. 11. FIG. 13 is a schematic sectional view taken along line XIII-XIII in FIG. 11.

The wiring board 10B illustrated in FIGS. 11 to 13 include structural sections including capacitors 18 having different capacitance values. Here, as an example, the wiring board 10B includes structural sections 10a and 10c illustrated in FIGS. 5A to 7B.

Wires 12 and 13 functioning as signal wires and a capacitor 18 are provided at upper and lower surfaces of an insulating layer 11a, respectively. Ground (GND) plane layers 20 are also provided at upper and lower surfaces of the insulating layer 11a near the wires 12 and 13, where the GND plane layers 20 form conductor patterns and are defined as ground potentials. The GND plane layers 20 are provided at an outside of and without contacting the wires 12 and 13 so as not to overlap the wires 12 and 13 projectively as viewed from the top. Further, the wiring board 10B includes GND vias 21 and GND conductors 22 and 23 near conductors 16 and vias 17 coupled to the wires 13. The GND vias 21 are coupled to the GND plane layers 20 and form conductor patterns. Each GND via 21 includes a GND via portion 21a, a GND via portion 21b, and a GND via portion 21c, which extend through the insulating layer 11a, an insulating layer 11b, and an insulating layer 11c, respectively. Each GND conductor 22 is provided at an upper side of the insulating layer 11b so as to be coupled to its corresponding GND via portion 21b. Each GND conductor portion 23 is provided at a lower side of the insulating layer 11c so as to be coupled to its corresponding GND via portion 21c.

Accordingly, in the wiring board 10B, conductor patterns, which are defined as GND potentials, are provided near the structural sections 10a and 10c through which a predetermined or certain signal is transmitted. Therefore, in the wiring board 10B, enhancement of transmission characteristics is promoted as a result of, for example, suppressing mismatching of a characteristic impedance Z0 and the influence of a return current in high-speed signal transmission. The interval between the signal wires and the conductor patterns is set, for example, from 30 µm to 100 µm, where the signals wires are the wires 12 and 13 of the structural sections 10a and 10c and the conductor patters are the GND plane layers 20 which are defined as the GND potentials.

In the wiring board 10B, d1 is assumed as the distance between the via 17 at the structural section 10a and the GND via 21 disposed close to the via 17, where the structural section 10a includes the capacitor 18 having a certain capacitance value. d2 is assumed as the distance between the via 17 at the structural section 10c and the GND via 21 disposed close to the GND via 17, where the structural section 10c includes the capacitor 18 having a capacitance value different from the certain capacitance. In the wiring board 10B, even if the structural sections 10a and 10c in which the capacitors 18 have different capacitance values are used, the occupied areas of the capacitors 18 may be about the same, so that it is possible for the distances d1 ad d2 to be fixed values. For example, it is possible for the distances d1 and d2 to be 200 µm.

Here, for comparison, there is described a case in which a conductor pattern defined as a GND potential is further provided on a wiring board 100 including structural sections 100a and 100c, such as those illustrated in FIGS. 1A and 1B and FIGS. 3A and 3B, where the structural sections 100a and 100c have respective capacitors 110 having capacitance values different from each other.

Figure 15A:
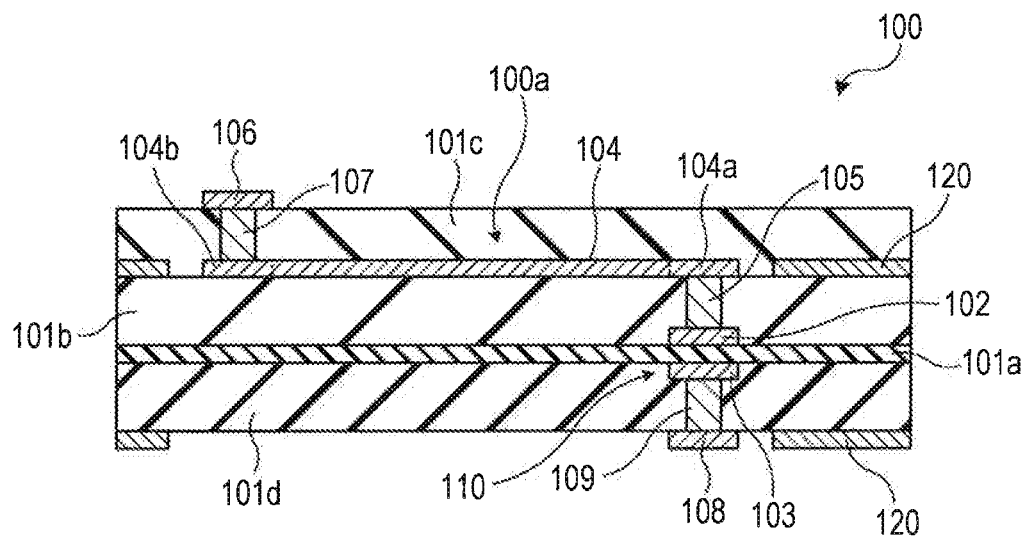
FIGS. 15A and 15B each illustrate the comparative example of the wiring board (part 2)
Figure 15B:
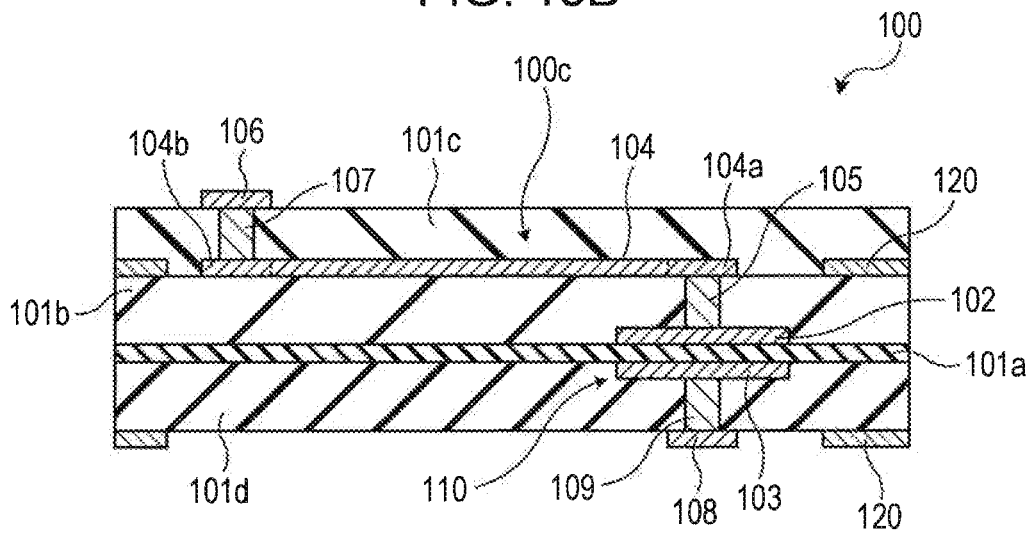
Figure 16:
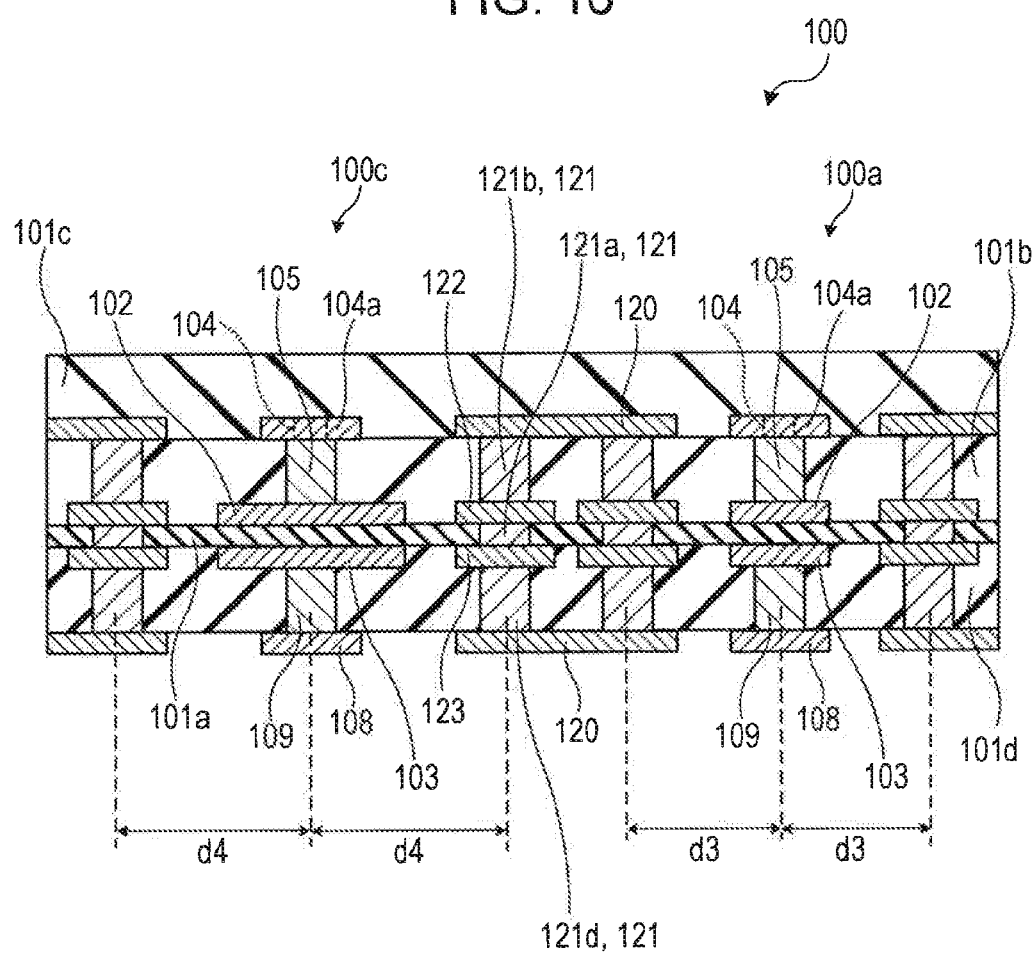
FIG. 16 illustrates the comparative example of the wiring board (part 3)

FIGS. 14 to 16 illustrate a wiring board 100 according to a comparative example. FIG. 14 is a schematic top view of the wiring board 100 according to the comparative example. FIG. 15A is a schematic sectional view taken along line XVA-XVA in FIG. 14. FIG. 15B is a schematic sectional view taken along line XVB-XVB in FIG. 14. FIG. 16 is a schematic sectional view taken along line XVI-XVI in FIG. 14.

The wiring board 100 illustrated in FIGS. 14 to 16 each include a structural section 100a illustrated in FIGS. 1A and 1B and a structural section 100c illustrated in FIGS. 3A and 3B as structural sections including capacitors 110 having capacitance values different from each other.

The wiring board 100 is provided with GND plane layers 120 provided at an upper side of an insulating layer 101b and a lower side of an insulating layer 101d so as to be close to and out of contact with a wire 104 and a conductor 108. The insulating layer 101b is provided with the wire 104 serving as a signal wire. The insulating layer 101d is provided with the conductor 108. The GND plane layers 120 are provided outwardly of conductors 102 and 103, functioning as a capacitor 110, so as not to overlap conductors 102 and 10 projectively as viewed from the top. Further, the GND vias 121 and GND conductors 122 and 123 are provided near the vias 105 and 109, where the GND vias 121 are coupled to the GND plane layers 120 and the wire 104 and the conductor 108 are respectively coupled to the conductors 102 and 103 serving as capacitor 110. Each GND via 121 includes a GND via portion 121a, a GND via portion 121b, and a GND via portion 121c, which extend through the insulating layer 101a, the insulating layer 101b, and an insulating layer 101d, respectively. Each GND conductor 122 is provided at an upper side of the insulating layer 11a so as to be coupled to its corresponding GND via portion 121a and GND via portion 121b. Each GND conductor portion 123 is provided at a lower side of the insulating layer 101a so as to be coupled to its corresponding GND via portion 121a and its corresponding GND via portion 121d.

Even in such a wiring board 100, conductor patterns defined as GND potentials may be provided near the structural sections 100a and 100c through which a predetermined or certain signal is transmitted. In the wiring board 100, d3 is the distance from the vias 105 and 109 of the structural section 100a to the GND via 121 that is close to the vias 105 and 109. In addition, in the wiring board 100, d4 is the distance from the vias 105 and 109 of the structural section 100c to the GND via 121 that is close to the vias 105 and 109 of the structural section 100c. In the wiring board 100, the structural section 100c has a capacitor 110 having larger capacitance value than that in the structural section 100a. Accordingly, the areas of the conductors 102 and 103 of the structural section 100c are larger than those of the conductors 102 and 103 of the structural section 100a. As a result, the distance d4 is larger than the distance d3. When the capacitance value of the capacitor 110 of the structural section 100c and the capacitance value of the capacitor 18 of the structural section 10c of the wiring board 10B are the same, the distance d4 is also larger than the distance d1 (d2). In the wiring board 100, the distance from the vias 105 and 109, serving as signal vias, to the GND via 121 varies in the range of, for example, 200 μm to 500 μm based on the capacitance value of the capacitor 110. When the GND vias 121 are disposed away from the vias 105 and 109, serving as signal vias, the transmission characteristics may deteriorate due to mismatching of the characteristic impedance.

In contrast, as described above, in the wiring board 10B, even in the structural sections 10a and 10c in which the capacitance values of the capacitors 18 differ from each other, it is possible to fix the distances d1 and d2 respectively between the vias 17, serving as a signal via, and the GND vias 21 disposed close to corresponding via 17. According to the wiring board 10B of the second embodiment, it may be possible to suppress a reduction in the arrangement density of the signal wires by suppressing an increase in the occupied area of the capacitor 18, and obtain a desired capacitance value, so that better transmission characteristics may be obtained.

Figure 17:
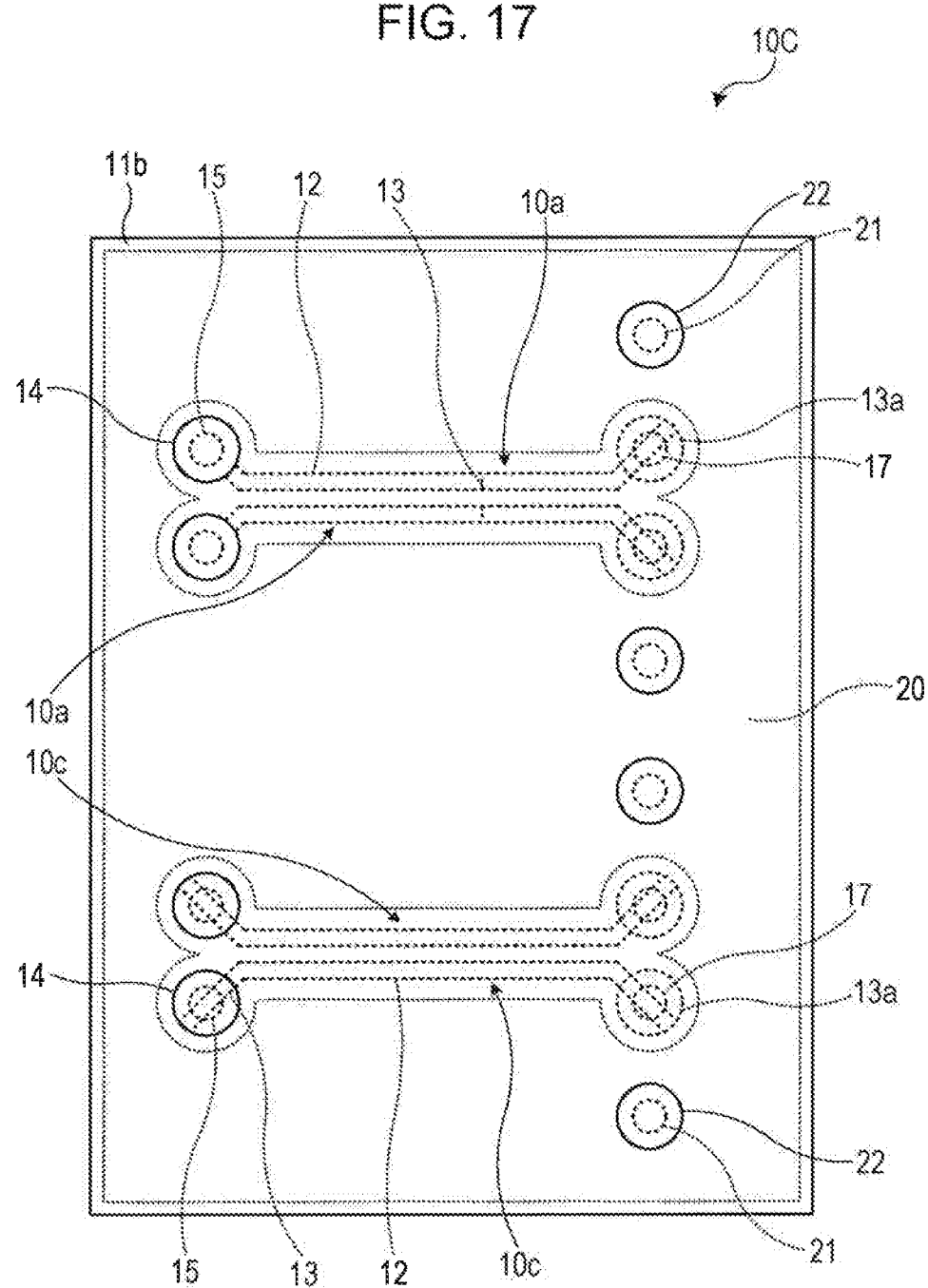
FIG. 17 illustrates an exemplary wiring board according to a third embodiment.

Next, a third embodiment is described. FIG. 17 illustrates an exemplary wiring board 10C according to the third embodiment. FIG. 17 is a schematic top view of the exemplary wiring board 10C according to the third embodiment.

The wiring board 10C illustrated in FIG. 17 includes an exemplary structure in which structural sections 10a and structural sections 10c are disposed in parallel, where the structural sections 10a and 10c are illustrated in FIGS. 5A and 5B and illustrated in FIGS. 7A and 7B, respectively. As with the wiring board 10B illustrated in FIGS. 12A to 13, GND plane layers 20, GND vias 21, GND conductors 22, and GND conductors 23 are provided near the structural sections 10a and 10c. The wiring board 10C differs from the wiring board 10B according to the second embodiment due to such a structure.

In the wiring board 10C, the pair of structural sections 10a and the pair of structural sections 10c, both pair disposed in parallel with each other, are used as pair transmission paths (P and N wires) through which signals are transmitted by a differential transmission system. That is, in the pair of structural sections 10a, differential signals are transmitted through wires 12 and 13 of one of the structural sections 10a and wires 12 and 13 of the other structural section 10a. Similarly, in the pair of structural sections 10c, differential signals are transmitted through wires 12 and 13 of one of the structural sections 10c and wires 12 and 13 of the other structural section 10c.

In each transmission path pair, it is desirable that the interval between the transmission paths be fixed. In the wiring board 10C using the structural sections 10a and the structural sections 10c for the transmission path pairs, the interval between the transmission paths of each pair (that is, the interval between the wires 12 and 13 of one pair and the wires 12 and 13 of the other pair) may be fixed.

As in FIGS. 12A to 13, in the wiring board 10C, the GND plane layers 20 are provided around the pair of structural sections 10a, and there are provided, near vias 17 serving as signal, vias the GND vias 21 and the GND conductors 22 and 23 that are connected to the GND vias 21. It is possible to provide each GND via 21 at a distance d1 from the closest via 17. As in FIGS. 12A to 13, in the wiring board 10C, the GND plane layers 20 are provided around the pair of structural sections 10c, the GND vias 21 are provided near the corresponding vias 17, serving as signal vias, and the GND conductors 22 and 23 that are connected to the GND vias 21 are provided. It is possible to provide each GND via 21 at a distance d2 from the closest via 17.

As described above, when the structural sections 10a and 10c are used, the distance d1 between each via 17 and its corresponding GND via 21, and the distance d2 between each via 17 and its corresponding GND via 21 may be fixed, where each via 17 serves as a signal via. These configurations may make it possible to, for example, suppress mismatching of a characteristic impedance and improve transmission characteristics.

According to the wiring board 10C of the third embodiment, it may be possible to suppress an increase in the occupied areas of capacitors 18 to suppress a reduction in the arrangement density of the signal wires for transmitting differential signal provided at a fixed interval and dispose them. In addition, it may be possible to obtain desired capacitance values of the capacitors 18 formed by the differential wires. In the wiring board 10C using the differential transmission system, it may be possible to suppress mismatching of a characteristic impedance and obtain good transmission characteristics.

Figure 18:
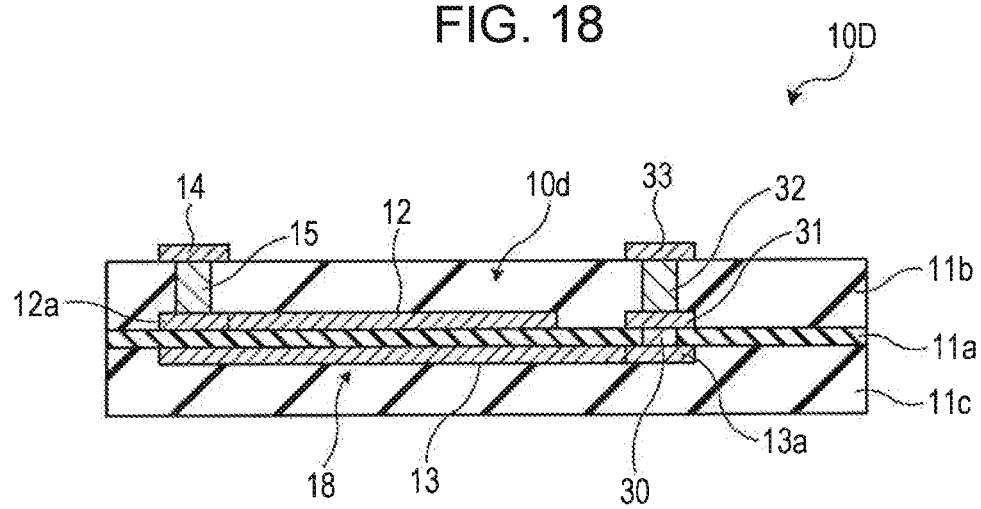
FIG. 18 illustrates an exemplary wiring board according to a fourth embodiment.

Next, a fourth embodiment is described. FIG. 18 illustrates an exemplary wiring board 10D according to the fourth embodiment. FIG. 18 is a schematic sectional view of the exemplary wiring board 10D according to the fourth embodiment.

In the first embodiment, there is described the case in which a signal is transmitted between the front surface and the back surface of the wiring board 10A. It is also possible to transmit a signal to a different region from a certain region of the front surface as in the wiring board 10D according to the fourth embodiment illustrated in FIG. 18.

In the wiring board 10D, as with the wiring board 10A, wires 12 and 13 are provided as signal wires on upper and lower surfaces of an insulating layer 11a. A conductor 14, disposed at an upper side of an insulating layer 11b, is coupled to a land 12a of a wire 12 via a via 15 extending through the insulating layer 11b. A via 30 extending through the insulating layer 11a is coupled to a land 13a of the wire 13. The via 30 is coupled to a conductor 33, disposed at the upper side of the insulating layer 11b, via a conductor 31, disposed at an upper side of the insulating layer 11a, and a via 32 extending through the insulating layer 11b.

In the wiring board 10D including the structural section 10d described above, the conductor 14 is used, for example, as a pad to which a terminal of an electronic component is coupled, where the electronic component is for example a semiconductor device that is mounted on the wiring board 10D. In addition, the conductor 14 is used also as a conductor that is connected to such the pad to be coupled to the terminal of the electronic component. Similarly, the conductor 33 is also used, for example, as a pad to which a terminal of an electronic component is couple, where the electronic component is the same as or different from the electronic component that is connected to the conductor 14, for example, a semiconductor device, that is mounted on the wiring board 10D. In addition, the conductor 33 is used also as a conductor that is connected to such the pad to be coupled to the terminal of the electronic component.

Even in the wiring board 10D, as with the wiring board 10A, the wires 12 and 13 are disposed in parallel so as to be oppose each other with the insulating layer 11a being interposed therebetween, so that a capacitor 18 is formed. The capacitance value of the capacitor 18 is adjustable by changing the length of a portion where the wires 12 and 13 oppose each other.

In the wiring board 10D, for example, a high-speed signal is transmitted through the wire 12 via the via 15 from the conductor 14 on one of the surfaces (front surface). Further the high-speed signal is transmitted to the capacitor 18, formed by the wires 12 and 13 that oppose each other with the insulating layer 11a being interposed therebetween. When the transmitted high-speed signal passes the capacitor 18, a low-frequency-domain component included in the high-speed signal is cut or suppressed. The high-speed signal whose low-frequency-domain component has been cut or suppressed is transmitted to the wire 13. The high-speed signal transmitted to the wire 13 is transmitted to the conductor 33 at the front surface via the via 30, the conductor 31, and the via 32.

Even in the wiring board 10D that transmits a signal to a different region at the front surface in this way, it may be possible to suppress a reduction in the arrangement density of the signal wires by suppressing an increase in the occupied area of the capacitor 18, and obtain a desired capacitance value.

Even in the wiring board 10D, it may be possible to provide predetermined or certain conductor patterns, such as GND plane layers and GND vias, near or around the structural section 10d in accordance with the wiring board 10B described in the second embodiment, where the GND plane layers and GND vias are defined as GND potentials.

It may be also possible to use such structural sections 10d for a pair of transmission paths through which differential signals are transmitted in accordance with the wiring board 10C described in the third embodiment. Next, a fifth embodiment is described.

It may be possible to mount an electronic component, such as a semiconductor device, on any one of the wiring boards 10A to 10D and 10Aa and 10Ab as mentioned above. The wiring boards 10A to 10D, 10Aa, and 10Ab on which such an electronic component is mounted may be mounted on another wiring board, such as a mother board.

Figure 19:
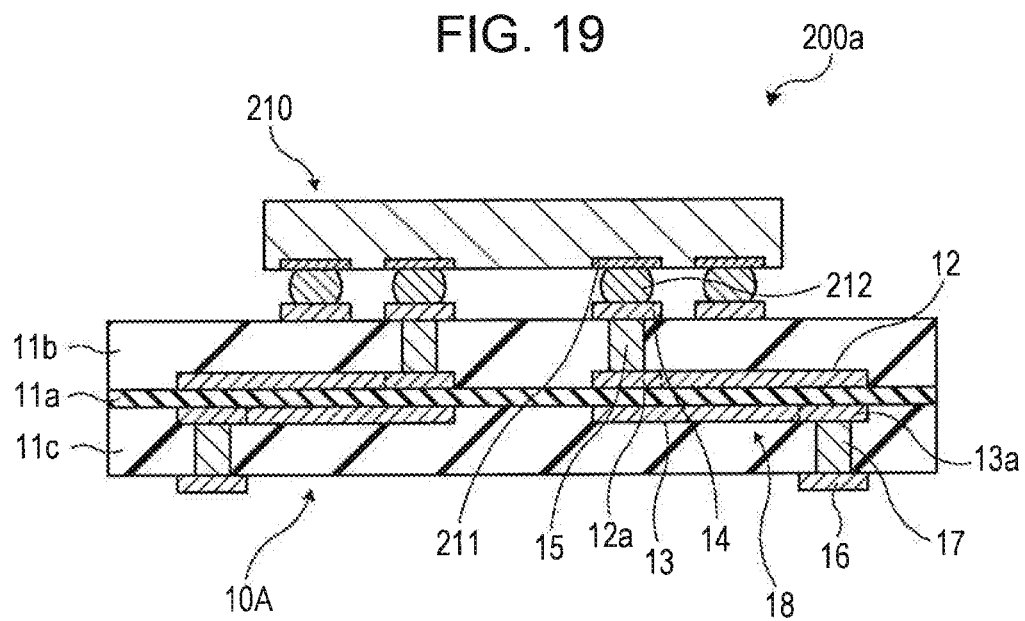
FIG. 19 illustrates an exemplary structure of an electronic apparatus (part 1)
Figure 20:
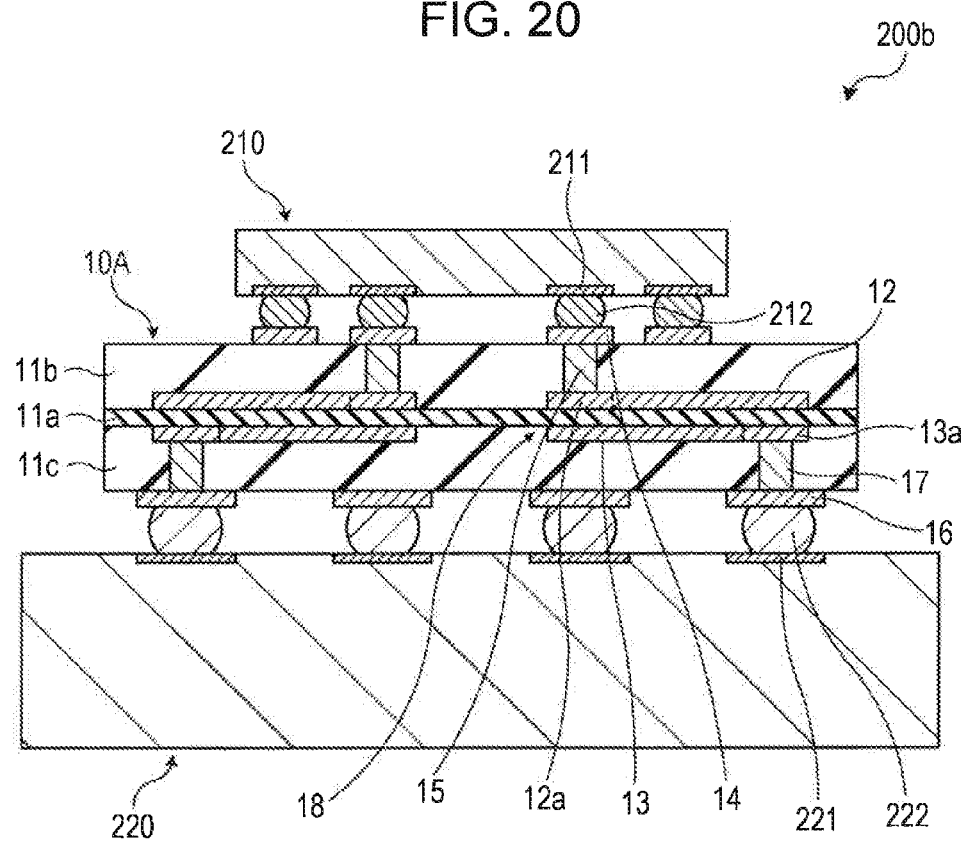
FIG. 20 illustrates an exemplary structure of an electronic apparatus (part 2)

FIGS. 19 and 20 illustrate structural examples of electronic apparatuses 200a and 200b. FIG. 19 illustrates the exemplary electronic apparatus 200a in which a semiconductor device 210 is mounted on a wiring board 10A including a structural section 10c. A terminal 211 of the semiconductor device 210 is coupled to a conductor 14 of the wiring board 10A using a bump 212, such as solder, so that the semiconductor device 210 is mounted on the wiring board 10A.

FIG. 20 illustrates the electronic apparatus 200b in which a wiring board 10A, on which a semiconductor device 210 is mounted as illustrated in FIG. 19, is mounted on a mother board 220. In the wiring board 10A, on which the semiconductor device 210 is mounted, a conductor 16 is coupled to a terminal 221 of the mother board 220 using a bump 222, such as solder, so that the wiring board 10A is mounted on the mother board 220.

It may be possible to obtain an electronic apparatus as described above using any of the other wiring boards 10B to 10D, 10Aa, and 10Ab. Next, a sixth embodiment is described.

Here, an exemplary method for forming a wiring board is described as the sixth embodiment. FIGS. 21A to 24B illustrate an exemplary method for forming a wiring board. FIGS. 21A to 24B are schematic sectional views of the steps for forming the wiring board. With reference to FIGS. 21A to 24B, the steps of the exemplary method for forming the wiring board are described in succession.

Figure 21A:
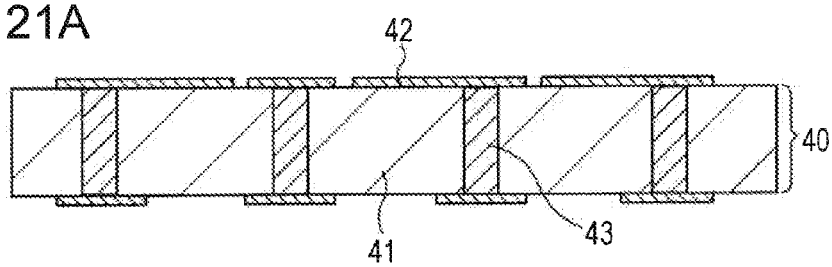
FIGS. 21A to 21D illustrate an exemplary method for forming a wiring board (part 1)

First, the step for forming a basic structure of the wiring board is described. Here, the formation of a buildup board by a semi-active method is taken as an example. First, a core layer 40, illustrated in FIG. 21A, is prepared. The core layer 40 includes a core base 41, conductor layers 42, formed of Cu, and vias 43, formed using Cu. The core base 41 is formed of, for example, glass epoxy or ceramic. The conductor layers 42 are subjected to patterning at the front and back surfaces of the core base 41. Each via 43 extends through the core base 41 and couples the front and back conductor layers 42.

Figure 21B:
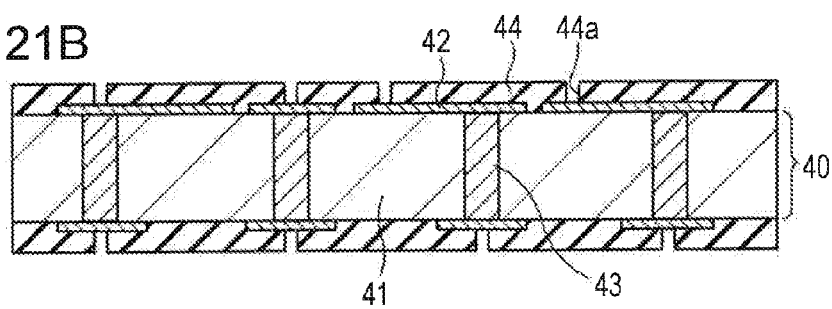

Next, as illustrated in FIG. 21B, openings 44a extending to the conductors 42 are formed by placing insulating films, which become insulating layers 44 and which are formed of, for example, epoxy resin or polyimide resin, on the front and back surfaces of the core layer 40 and by illuminating predetermined locations of the insulating films with laser.

Figure 21C:
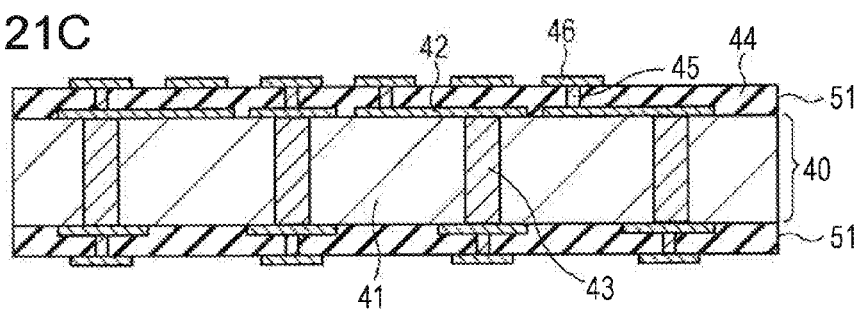

Next, as illustrated in FIG. 21C, vias 45 are formed at the openings 44a of the insulating layers 44 (insulating films), and conductor layers 46 coupled to the vias 45 are formed on the insulating layers 44. After the openings 44a have been formed in the insulating layers 44 using the laser as mentioned above, for the vias 45 and the conductor layers 46, Cu seed layers are formed on the insulating layers 44 by electroless Cu plating. Next, a dry film resist is formed and patterning thereof is performed, to form a resist pattern in which openings are formed in regions where the conductor layers 46 are formed. Next, the resist pattern is masked to perform electroless Cu plating or electrolytic Cu plating. Thereafter, the resist pattern is peeled, and, then, the Cu seed layers exposed after the peeling are removed. This allows the vias 45 and the conductor layers 46 illustrated in FIG. 21C to be formed.

Figure 21D:
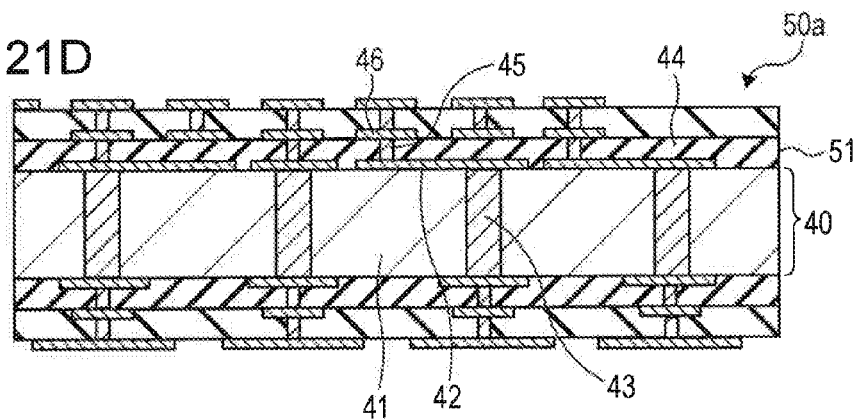

The steps illustrated in FIGS. 21B and 21C are repeated to form a buildup board 50a including a predetermined number of insulating layers 44, vias 45, and conductor layers 46 (buildup layers 51). FIG. 21D illustrates the buildup board 50*a* in which two buildup layers 51 are formed on each of the front and back surfaces of the core layer 40.

Next, the formation of a capacitor is described. Here, a case in which a film capacitor 60 is placed upon the buildup board 50*a* formed as described above to form a wiring board incorporating a capacitor is described.

Figure 22A:
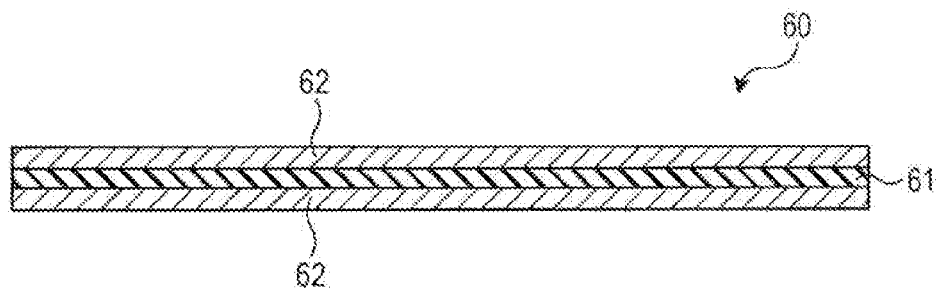
FIGS. 22A and 22B illustrate the exemplary method for forming the wiring board (part 2)

First, the film capacitor 60 illustrated in FIG. 22A is prepared. The film capacitor 60 includes an insulating layer 61 and conductor layers 62 provided on the front and back surfaces of the insulating layer 61. The insulating layer 61 is formed of an organic material, such as polyethylene terephthalate, polypropylene, polycarbonate, and polyphenylene sulfide, or an inorganic material, such as ceramic. The conductor layers 62 formed on the front and back surfaces of such an insulating layer 61 are formed of, for example, Cu.

Figure 22B:
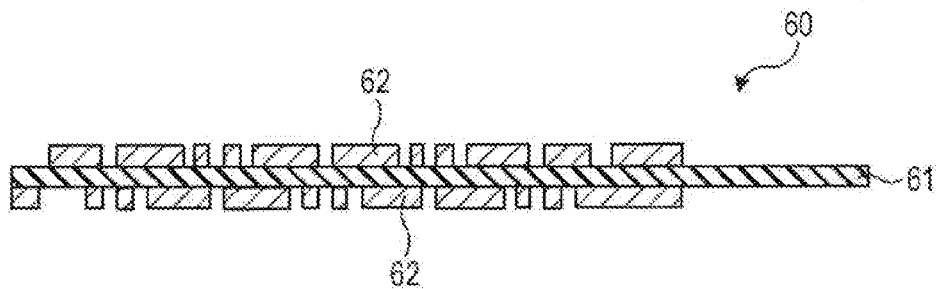

Next, as illustrated in FIG. 22B, the conductor layers 62 of the prepared film capacitor 60 are subjected to patterning. By the patterning of the conductor layers 62, it is possible to form predetermined conductor patterns of, for example, power supply wires (including GND plane layers) in addition to signal wires.

Figure 23A:
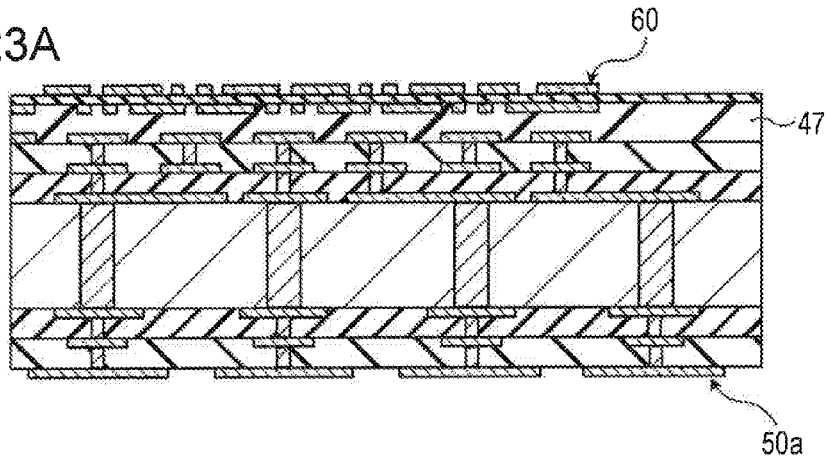
FIGS. 23A to 23C illustrate the exemplary method for forming the wiring board (part 3)

Next, as illustrated in FIG. 23A, the film capacitor 60 whose conductor layers 62 have been subjected to patterning is placed on the buildup board 50*a* where an insulating film has been placed as an insulating layer 47.

Figure 23B:
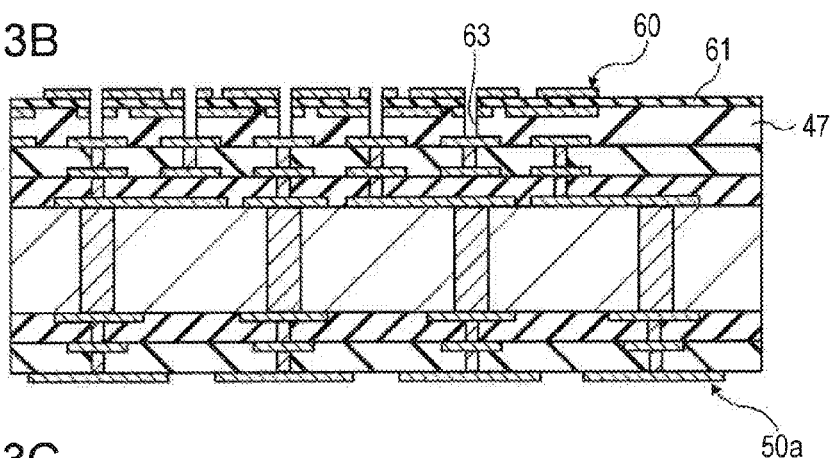

Next, as illustrated in FIG. 23B, using laser, the insulating layer 61 of the film capacitor 60 and the insulating layer 47 (insulating film), disposed at the lower side of the insulating layer 61, are removed together, to form via holes 63.

Figure 23C:
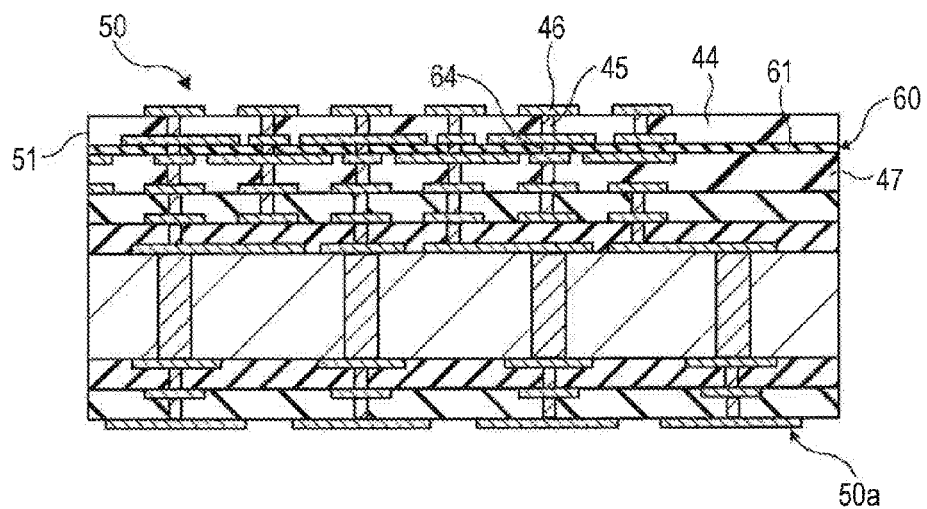

Next, as illustrated in FIG. 23C, vias 64 are formed at the via holes 63, to form a buildup layer 51. After forming the via holes 63, the vias 64 are formed by forming a Cu seed layer by performing electroless Cu plating, forming a dry film resist and subjecting the dry film resist to patterning, masking the resist pattern to perform electroless Cu plating or electrolytic Cu plating, peeling the mask, and removing the Cu seed layer. The buildup layer 51 is formed by forming the insulating layer 44, the vias 45, and the conductor layers 46 using the procedure illustrated in FIGS. 21B and 21C. This causes a wiring board 50 incorporating a capacitor to be formed.

Using such a method, in addition to structural sections 10*a* to 10*d* such as those described in any one of the first to fourth embodiments, predetermined conductor patterns of, for example, signal wires or power supply wires (including GND plane layers) are formed on predetermined locations of the wiring board 50.

Next, the formation of a terminal is described. It may be possible to form a terminal 70 illustrated in FIG. 24A or a terminal 80 illustrated in FIG. 24B at the wiring board 50 that is formed as described above.

Figure 24A:
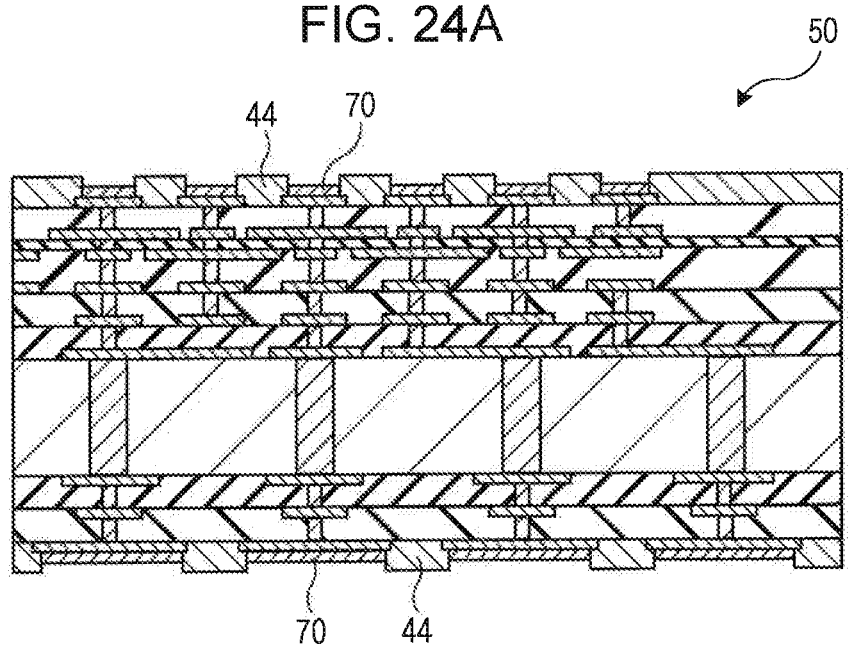
FIGS. 24A and 24B illustrate the exemplary method for forming the wiring board (part 4).

For example, it may be possible to form the terminal 70 illustrated in FIG. 24A by, after forming a protective film 71, such as a solder resist, on the wiring board 50, forming a laminated film of nickel (Ni)/gold (Au) by performing electroless Ni plating and electroless Au plating. After performing the electroless Au plating or in place of the electroless Au plating, solder plating may be performed.

Figure 24B:
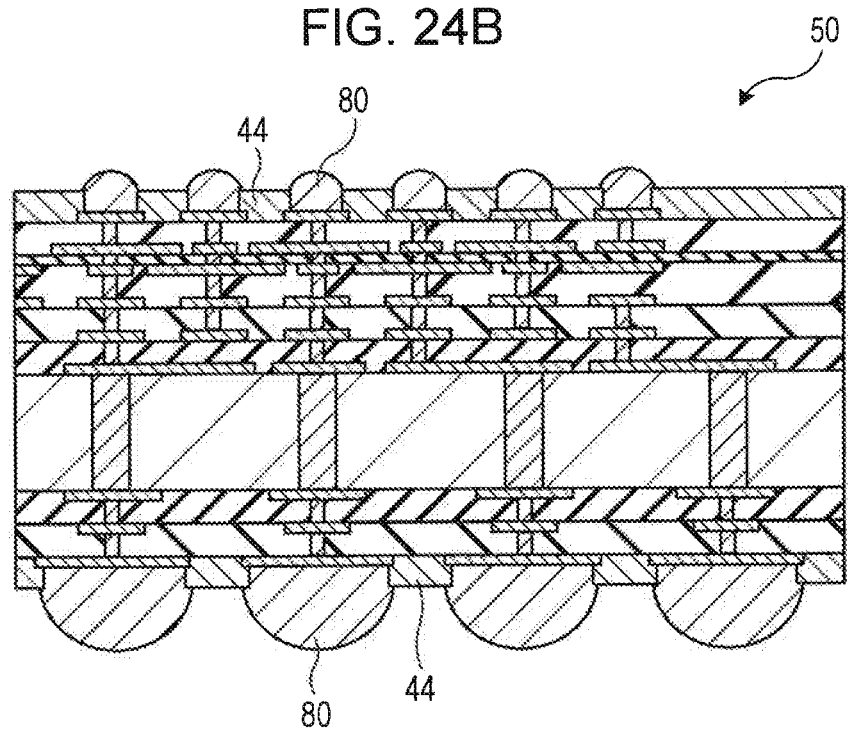

It may be possible to form the terminal 80 illustrated in FIG. 24B by, after forming the protective layer 71, forming a solder bump by, for example, performing solder plating, printing a solder paste, or mounting a solder ball. It may be possible to perform reflow after forming the solder bump.

By performing the steps described above, it is possible to form the wiring board 50 incorporating a capacitor.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring board comprising:
   a first insulating layer;
   a first wire that is provided at a first surface of the first insulating layer, transmits a first signal, and has a linear shape;
   a second wire that is provided at a second surface of the first insulating layer that is opposite to the first surface, includes a first portion that is parallel to at least a portion of the first wire, has a linear shape, and transmits a first component of the first signal that is transmitted through the first wire;
   a first land that is provided at the first surface and that is coupled to the first wire; and
   a second land that is provided at a location of the second surface differing from a location opposing the first land and that is coupled to the second wire,
   wherein the first portion is provided between the first land and the second land and a capacitance value between the first wire and the second wire is changeable based on a length of the first portion.

2. The wiring board according to claim 1, further comprising:
   a first via that is provided at a side of the first surface of the first insulating layer and that is coupled to the first land; and
   a second via that is provided at a side of the second surface of the first insulating layer and that is coupled to the second land.

3. The wiring board according to claim 1, further comprising:
   a first via that is provided at a side of the first surface of the first insulating layer and that is coupled to the first land; and
   a second via that extends through the first insulating layer and that is coupled to the second land.

4. The wiring board according to claim 1, further comprising:
   a third wire that is provided at the first surface and transmits a second signal; and
   a fourth wire that is provided at the second surface, includes a second portion that is parallel to at least a portion of the third wire and whose length differs from that of the first portion, and transmits a second component of the second signal that is transmitted through the third wire.

5. The wiring board according to claim 4, comprising:
   a first via and a second via that are provided at a side of the second surface of the first insulating layer and that are coupled to the second wire and the fourth wire, respectively; and
   a third via and a fourth via that are provided near the first via and the second via, respectively, and that are defined as ground potentials, wherein a distance between the first via and the third via and a distance between the second via and the fourth via are fixed.

6. The wiring board according to claim 1, further comprising:
a fifth wire that is provided at the first surface so as to be parallel to the first wire and transmits a third signal; and
a sixth wire that is provided at the second surface so as to be parallel to the second wire, includes a third portion that is parallel to at least a portion of the fifth wire, and transmits a third component of the third signal that is transmitted through the fifth wire.

7. The wiring board according to claim 1, further comprising:
a second insulating layer that is provided at a side of the first surface or a side of the second surface of the first insulating layer and has a dielectric constant that is lower than that of the first insulating layer.

8. An electronic apparatus comprising:
a wiring board; and
an electronic component that is mounted above the wiring board, the wiring board including
a first insulating layer,
a first wire that is provided at a first surface of the first insulating layer, transmits a first signal, and has a linear shape,
a second wire that is provided at a second surface of the first insulating layer that is opposite to the first surface, includes a first portion that is parallel to at least a portion of the first wire, has a linear shape, and transmits a first component of the first signal that is transmitted through the first wire,
a first land that is provided at the first surface and that is coupled to the first wire; and
a second land that is provided at a location of the second surface differing from a location opposing the first land and that is coupled to the second wire,
wherein the first portion is provided between the first land and the second land and a capacitance value between the first wire and the second wire is changeable based on a length of the first portion.

9. A method for producing an electronic apparatus, the method comprising:
preparing a wiring board; and
mounting an electronic component onto the wiring board,
wherein the wiring board includes
a first insulating layer,
a first wire that is provided at a first surface of the first insulating layer, transmits a first signal, and has a linear shape,
a second wire that is provided at a second surface of the first insulating layer that is opposite to the first surface, includes a first portion that is parallel to at least a portion of the first wire, has a linear shape, and transmits a first component of the first signal that is transmitted through the first wire,
a first land that is provided at the first surface and that is coupled to the first wire; and
a second land that is provided at a location of the second surface differing from a location opposing the first land and that is coupled to the second wire,
wherein the first portion is provided between the first land and the second land and a capacitance value between the first wire and the second wire is changeable based on a length of the first portion.

* * * * *